United States Patent [19]

McMurray et al.

[11] 4,145,686

[45] Mar. 20, 1979

[54] DATA COMPRESSOR

[75] Inventors: Robert D. McMurray, Midlothian; James R. Hicks, Darbyshire, both of Tex.

[73] Assignee: Recognition Equipment Incorporated, Dallas, Tex.

[21] Appl. No.: 810,252

[22] Filed: Jun. 27, 1977

[51] Int. Cl.$^2$ ............................................. H03K 13/00
[52] U.S. Cl. ............................................. 340/347 DD
[58] Field of Search ................ 340/347 DD; 235/310; 358/260, 261

[56] References Cited

U.S. PATENT DOCUMENTS

| | | | |
|---|---|---|---|
| 2,978,535 | 4/1961 | Brown | 358/261 |
| 3,553,362 | 1/1971 | Mounts | 358/261 |

FOREIGN PATENT DOCUMENTS 2,253,378  5/1974  Fed. Rep. of Germany ........... 358/260

*Primary Examiner*—Charles D. Miller

*Attorney, Agent, or Firm*—John E. Vandigriff; Thomas W. DeMond

[57] ABSTRACT

A data compressor with a plurality of serially connected shift registers compressing digital signals received from a data lift for transfer to a storage device which operates at a slower rate than the data lift generates digital signals. The data compressor eliminates from the data stream one of the frequently generated digital signals or a closely related group thereof and substitutes an address of the next digital signal which is not of the group being eliminated. Further, the data compressor eliminates trains of redundant signals which are longer than a certain minimum number of signals and substitutes a count which represents the number of redundant signals within each train therefor. The data compressor also inerts control markers into the data stream to identify the redundancy counts and the addresses which have been inserted therein. A logic sequencer controller is provided within the video data compressor controlling the elimination of data from the data stream and the insertion of the control markers, addresses and redundancy count therein.

19 Claims, 11 Drawing Figures

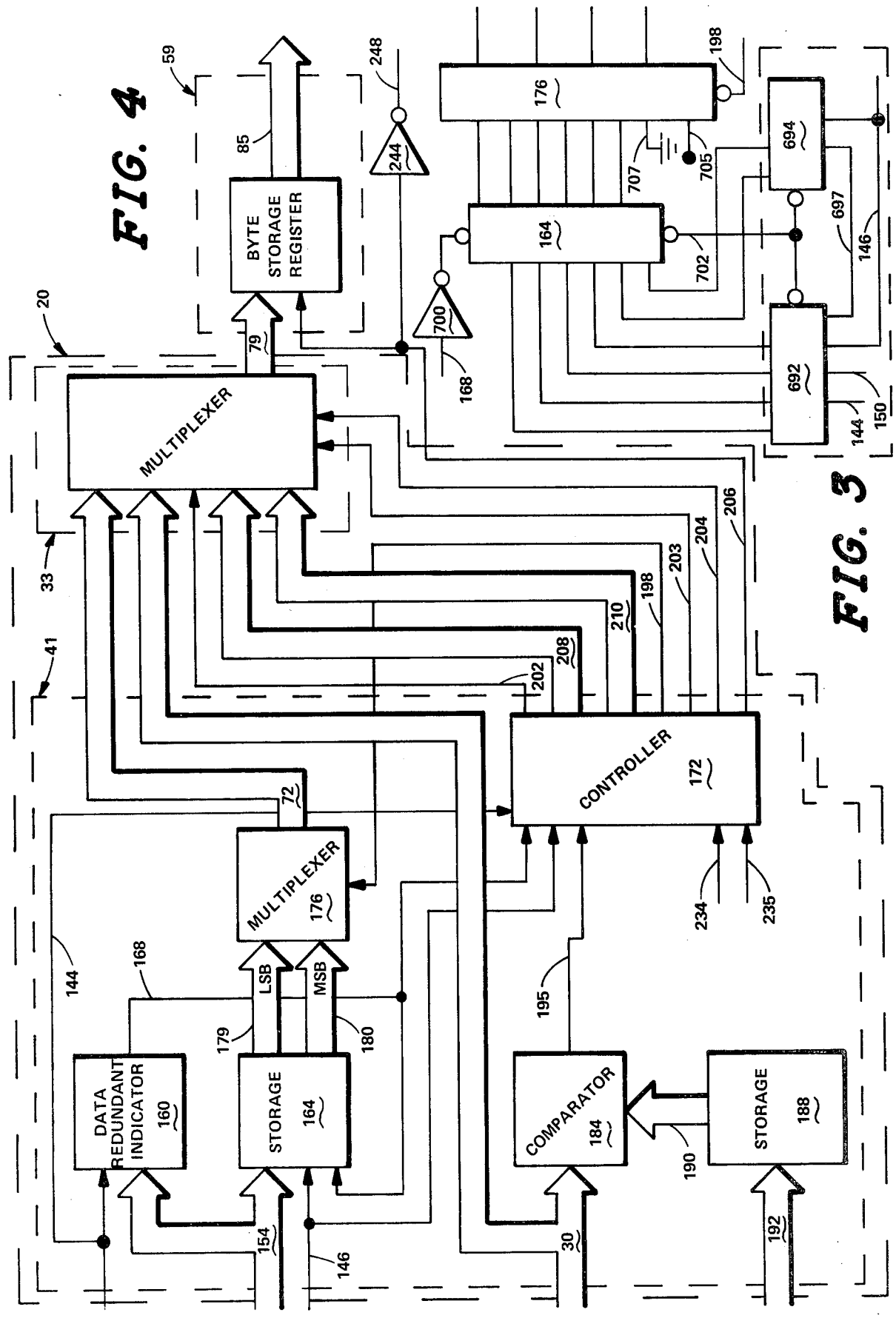

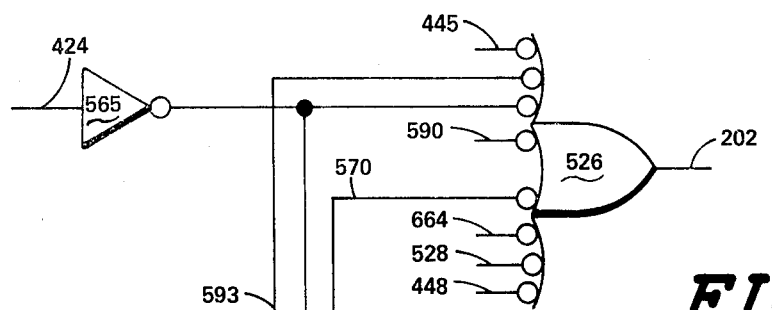
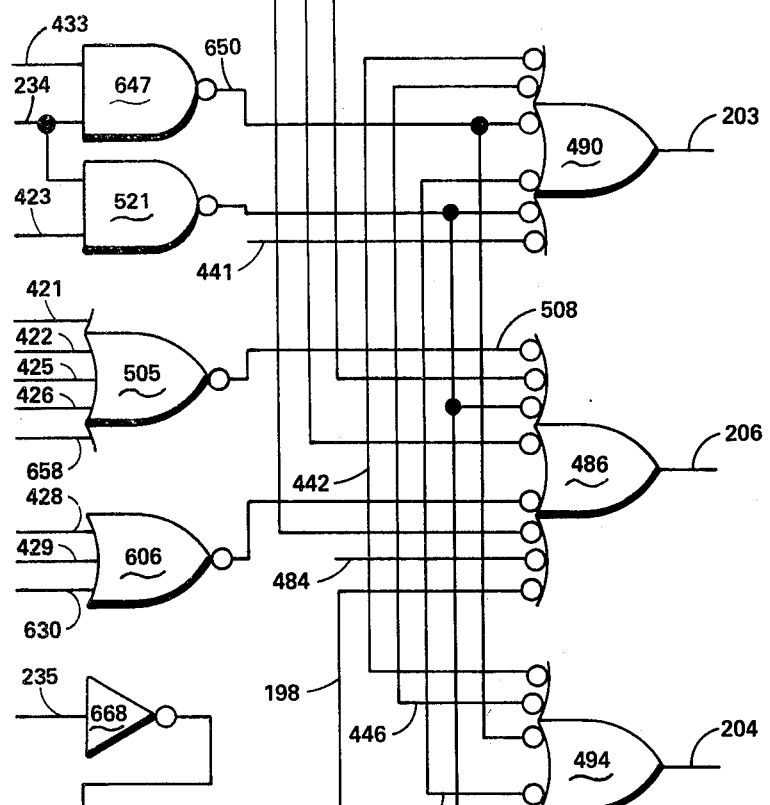
*FIG. 8*
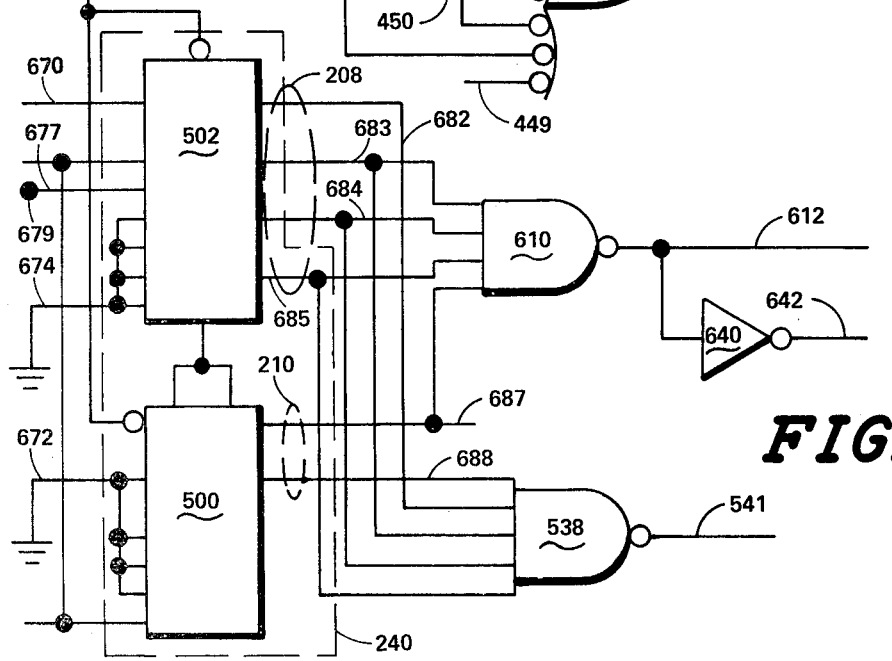
*FIG. 9*

DATA COMPRESSOR

BACKGROUND OF THE INVENTION

1. Field of the Invention

Invention relates to data compression and, more particularly, to methods and apparatus for compressing data comprised of digital signals.

2. Brief Description of the Prior Art

As is well known in the art, data can be generated by or transferred from one device at a higher rate than another device, which it is desired that the data can be permanently or temporarily stored there within or processed thereby, can receive or operate upon the data. Numerous methods are known in the prior art to compress data. Some of these methods result in an output of the compressor from which it is not possible to reconstruct the data in its entirety. Others utilize an encoding method known as run length encoding. An example of an apparatus utilizing run length encoding is shown in U.S. Pat. No. 3,502,806, issued to Townsend on Mar. 24, 1970 and entitled "Modified Run Length Data Reduction System". Townsend discloses a encoding technique in one embodiment of the invention which encodes both successive (redundance) binary digits of data and redundant background information. In Townsend the data being transmitted consist of logic "1" and "0" data words. These logic words represent the data scanned.

The system of data compression shown in U.S. Pat. No. 3,909,515, issued to Evansen on Sept. 30, 1975 and entitled "Facsimile System With Memory" is comprised of a memory which has each storage element assigned a unique address. A full line of data is stored in the memory. As the line is being fed into the memory the system will transmit the address of the first black area contained therein. At a later time the end address of that block of data is located and transmitted. At a later time, the data between the first and end addresses of that block of data is transmitted. This process is repeated until all the blocks of data on the line have been transmitted. The apparatus is then prepared to receive another line of data and repeat the above described operation.

None of the constructions or methods shown in the prior art disclose a system for compressing digital data which has an output from which the original data can be fully reconstructed and which eliminates redundancy between adjacent digital signals within the data stream and certain closely related primary signals in the data stream.

SUMMARY OF THE INVENTION

In the present invention, a data lift, information source (such as a communications link), or other device generates a stream of digital signals such as four bit data words. The data lift could be any of the numerous devices known in the art, for example, a photo cell array.

The present invention includes a memory means for receiving and storing the digital signals serially therein. A logic sequencer in the present invention monitors and compares the data contained in the memory means. The logic sequencer directs and controls the memory means and a multiplexer also included in the present invention. The memory means serially presents the data serially stored therein to the multiplexer. The multiplexer transfers that data to its output if commanded to do so by the logic sequencer. The logic sequencer inclues a means for eliminating from the data stream trains of redundant data and substituting a redundance count at the proper location in the data stream therefor. Further, the logic sequencer includes a means for eliminating a primary, frequently occurring, digital signal, for example, those signals representing background data and substituting an address indicating the locaiton of the next data which is not one of the primary signals. In other words, the primary signal is replaced by an individualized address which indicates the location of the next data word which is other than a primary signal.

Both the means for eliminating redundant data and the means for eliminating primary signals generate control markers which indicate that an address or alternatively a redundancy count has been inserted into the data stream. These means also through the logic sequencer direct the multiplexer to select the control markers and the redundancy count for row address as desired.

The memory means utilized can be a series of connected shift registers. The logic sequencer receives a scan start pulse from the data lift or other device that a scan or the beginning of a block of data has begun to be transferred to the memory means. In addition, the logic sequencer receives data timing pulses from the data lift indicating the rate at which the digital signals are being generated or transferred. This information is utilized to clock the data through the shift registers and allows the logic sequencer to insert the control markers, redundancy counts, and addresses at their proper locations within the data stream. The means for eliminating redundant data within the logic sequencer counts the number of redundancies in a train and, if the number of redundancies is over a predetermined amount such as four redundant signals a redundancy count is substituted therefor after the first redundant signal is transferred through the multiplexer. If the count is less than or equal to the predetermined value, the redundant train is allowed pass through the multiplexer.

When a primary signal such as a digital signal indicating a white background i.e. 0000 and perhaps other closely related minimal values such as 0001 are detected, the multiplexer under control of the means for eliminating primary signals within the logic sequencer generates a control marker which can be the primary signal, for example, 0000. When a digital signal is received by the shift registers which is other than the primary signal or the group of closely related signals, the address of that digital signal within the scan or row is outputted through the multiplexer and the digital signal which is not one of the primary signals is passed through the multiplexer after the row address has been passed.

Thus, the logic sequencer compares adjacent digital signals within the data stream to determine if a redundancy exists and monitors the stream to locate the primary signals within the data stream. It can be desirable that redundancy be determined by making a magnitude of difference calculation between the digital signals in adjacent shift registers. If that magnitude of difference is of a certain predetermined minimal value, the signals are determined to be redundant even though they are not identical. Thus, the data compressor compensates for minor variations of magnitude within the train of redundant signals. Different control markers are provided to indicate whether or not the information associated with a particular control marker is a redundancy count or an address. The logic sequencer is adapted to generate and transfer timing information to the device which receives the compressed data.

BRIEF DESCRIPTION OF THE DRAWINGS

FIG. 3 is a detailed logic diagram of portions of the data compressor as shown in FIG. 2;

FIG. 4 is a more detailed block diagram of a portion of the data compressor and a portion of the associated devices of FIG. 1;

FIGS. 6, 7, 8, and 9 comprise a detailed logic diagram of the controller of FIG. 4.

DESCRIPTION OF THE PREFERRED EMBODIMENT

Figure 1:
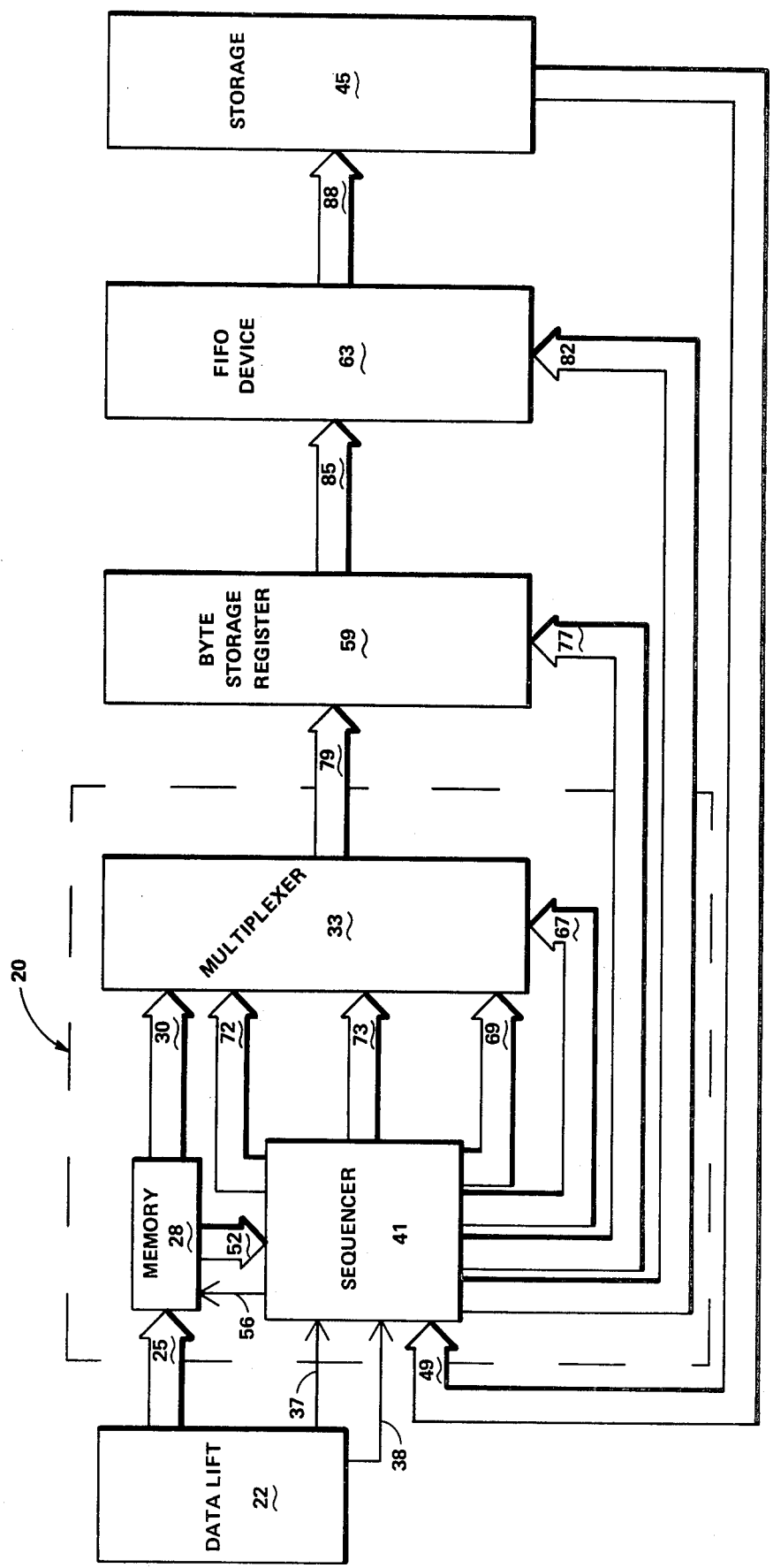
FIG. 1 is a block diagram of a data compressor constructed according to the present invention with associated input and output devices.

As shown in FIG. 1 the data compressor 20 of the present invention receives digital signals generated by a data lift 22 through a multi-line channel 25. A memory or storage device 28 receives the digital signals generated by data lift 22 serially and stores them in the order received. The memory device 28 can be comprised of a plurality of serially connected shift registers. Each digital signal received from data lift 22 is stored within memory 25 and shifted through the series of registers. The digital signal stored in the last register of memory 28 is shifted out of the serially connected plurality of registers. The last shift register is connected through a multi-line channel 30 to a multiplexer 33.

The data lift 22 also has outputs on lines 37 and 38 to a logic sequencer 41 of data compressor 20. Data lift 22 generates a begin scan or scan start pulse on line 37 as a new block or row of digital signals is transferred by data lift 22 to the memory 28. Data lift 22 also generates a data timing pulse on line 38 as an indication to sequencer 41 that a new digital signal is present on channel 25. The digital signal on line 25 could be for example, a 4-bit data word transferred in parallel from data lift 22 to memory 28. It is readily apparent that if memory 28 is composed of a plurality of shift registers those shift registers must be adapted to receive at least four lines of input in parallel and transfer that data word in parallel through the serially connected shift registers and through channel 30 to multiplexer 33.

The data lift 22 can be any device well known in the art which generates a digital signal or word as an output. It could be for example, an optical character recognition (hereinafter referred to as OCR) system which is reading data from a written medium on a row by row basis. The data lift could also be the output of a MICR data lift. If the data lift 22 is an OCR device the four-bit digital signals transferred by data lift 22 to memory 28 represent the output of each cell of a photocell array which has been converted from an analog signal to a four-bit digital word representing various levels of grey. If data lift 22 is an OCR device with a linear array, the begin scan pulse on line 37 indicates the beginning of a scan of the linear array and the timing pulses on lines 38 would represent the appearance of each digital signal representing one cell of the photocell array as an output from data lift 22 on channel 25.

The logic sequencer 41 also receives inputs from a storage means 45 which could for example be a digital computer with a random access memory and other storage devices. Storages means 45 is by way of example only. The output of compressor 20 could be connected to a processor. The output of storage means 45 through multi-line channel 49 is necessary to indicate to sequencer 41 when the storage means 45 is prepared to receive the compressed data. The other input to sequencer 41 is from memory 28 through multi-line channel 52. The inputs on channel 52 are the output of data lift 22 on channel 25 and the next adjacent digital signal in the stream stored in memory 28. In other words, sequencer 41 receives both the current output of the data lift 22 and the last digital signal transferred from data lift 22 and stored within memory 28. If memory 28 is a plurality of shift registers, sequencer 41 receives and monitors the output of the first shift register in the plurality of serially connected shift registers in addition to the output of data lift 22. Sequencer 41 provides a clock pulse on line 56 which is synchronized with the pulse on line 38 to shift the data through the memory 28 at the same rate as it is generated within the data lift 22.

Logic sequencer 41 also has outputs to multiplexer 33, byte storage register 59, and first-in first-out (hereinafter referred to as FIFO) memory device 63. Logic sequencer 41 provides selection signals to multiplexer 33 through multi-line channel 67. Channel 69 between logic sequencer 41 and multiplexer 33 allows logic sequencer 41 to strobe the multiplexer to form a part of the control markers (to be discussed in detail hereinafter). The other two multi-line channels 72 and 73 connected between logic sequencer 41 and multiplexer 33 provide multiplexer 33 with a count of the number of redundant signals in each train of redundant signals and the address of the next signal which is not of a group of primary signals, respectively, as generated by logic sequencer 41. The output of logic sequencer 41 to byte storage register 59 goes through multi-line channel 77 and includes timing and sequencing signals. The other input to byte storage register 59 is from multiplexer 33 through multi-line channel 79. Multi-line channel 79 carries the output of multiplexer 33 as selected by logic sequencer 41. The final output of logic sequencer 41 is to FIFO device 63 through multi-line channel 82. Multi-line channel 82 carries timing pulses to control the flow of digital from byte storage register 59 through the device. Byte storage 59 is connected to FIFO device 63 through a multiline channel 85. Finally, FIFO memory 63 has its output connected through multi-line channel 88 to the storage means 45. The timing signals on multi-line channel 82 are in part a result of the output of the storage means 45 on channel 49 to logic sequencer 41 to indicate if the storage means is prepared to receive data from the FIFO memory 63.

Figure 2:
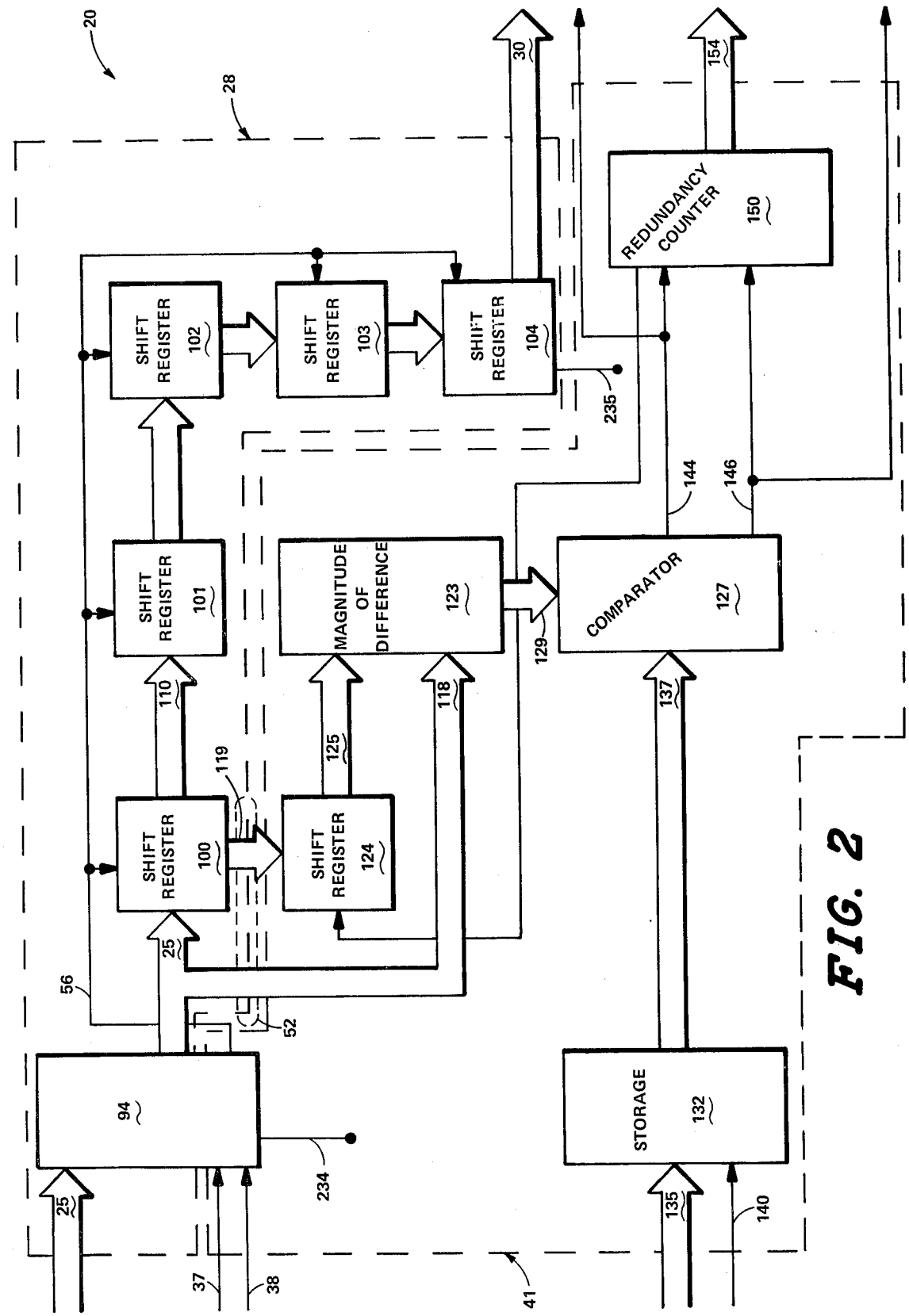
FIGS. 2 is a more detailed block diagram of a portion of the data compressor of FIG. 1.

Briefly the data flow through the block diagram of FIG. 1 is that the four-bit digital signal generated by the data lift 22 is passed serially through memory 28, four-bit digit signals appear at the output of multiplexer 33 as selected by logic sequencer 41 (which could be the digital signals generated by data lift 22, a control marker, a redundancy count, or an address) to byte storage register 59. The four bit digital signals from the output of multiplexer 33 are stacked within byte storage register 59 and formed into 24 bit words referred to as bytes which are passed to FIFO device 63 24-bits at a time. After storage within FIFO memory 63, the 24-bit words appear in the proper sequence at the output of memory 63 to storage means 45. in FIG. 2, the outputs of data lift 22 (FIG. 1) on channel 25 and lines 37 and 38 are inputs to a input select and synchronization circuit 94. Circuit 94 can be adapted to select between the outputs of several data lifts or test circuits as desired. In normal operation the digital signals on line 25 are shifted directly through a shift register in circuit 94 and into the first shift register 100 of the memory 28. The shift registers 100 through 104 are serially connected to move the digital signal received by the first shift register 100 from channel 25 through the memory 28 so that each digit signal appears as the output of the last shift register 104 in the identical order as received from channel 25. Unless it is desired to select between different streams of data it would be unnecessary for the channel 25 to pass through circuit 94. As shown in FIG. 2, portions of circuit 94 are in both the memory 28 and the logic sequencer 41 of FIG. 1.

Each of the shift registers 100 through 104 of memory 28 receives timing pulses on line 56 originating on line 38 which causes the register to transfer its input to its output. Thus, the output of shift register 100 which is received through multi-line channel 110 by shift register 101. The digital signal which is present on channel 110 as an output of shift register 100 is transferred to the output of shift register 101 and appears at the inputs to shift register 102. Thus, as the data timing pulses on line 56 are received by the shift registers, the digital signals are moved through the memory 28 until they eventually appear as the output of the last shift register 104 of the plurality of shift registers within the memory 28. The output of shift register 104 is received by the multiplexer 33 (FIG. 1) on channel 30.

As shown in FIG. 2, the channel 52 of FIG. 1 has been broken into two multi-line channels 118 and 119 which are connected to a magnitude of difference calculator 123 and a shift register 124, respectively. The output of the shift register 124 is an input to the magnitude of difference calculator 123 through multi-line channel 125. The results of the magnitude of difference calculation are received from the calculator 123 by comparator 127 through multi-line channel 129. A storage unit 132, which should be a shift register, has an input on multi-line channel 135 which is adjustable either manually or through examination by a processor (not shown) which is also receiving the digital signals from data lift 22. The signal on channel 135 is stored within storage unit 132 as its output. The output of unit 132 is connected to comparator 127 through multi-line channel 137. A line 140 is provided to indicate to storage unit 132 that the signal present on channel 135 should be transferred to its output. If the output of the magnitude of the magnitude of difference calculator 123 is greater than the output of storage unit 132, the output of the comparator on line 134 will go high and its output to line 146 goes low. Both the output on line 144 and 146 is connected to redundancy counter 150. Redundancy counter 150 counts the pulse on line 144 each time the pulse goes high. Further, redundancy ocunter 150 is reset to zero each occasion that the output of comparator 127 on line 146 goes low indicating that input to shift register 100 and its output are not redundant. Thus, redundancy counter 150 counts each redundant signal in a train of redundant digital signals that are closely related. Put another way, redundancy counter 150 counts each signal of a train of digital signals which differ by the set predetermined amount stored in storage unit 132 as redundant. If it is not desired to count as redundant those signals which are close in magnitude to the redundant signal being counted line 118 and line 119 could be connected to the inputs of comparator 127 as channels 129 and 137 are connected to comparator 127 as described above or the value stored within unit 132 can be set to zero.

The output of redundancy counter 150 is received by a data redundant indicator 160 and a redundancy count storage unit 164. The data redundant indicator 160 also has line 144 as an input. Redundancy indicator 160 structured so that its output of line 168 goes high if three counts are present in redundancy counter 150 and another high signal on line 144 indicating that another redundancy is received. Further, the output of data redundant indicator 160 is high if four or more counts are present in redundancy counter 150. The output of data redundant 160 on line 168 goes to controller 172 and redundancy count storage unit 164. As long as the output of data redundant indicator 160 is high storage unit 164 transfers the output of redundancy counter 150 to its output. Prior to counter 150 being reset by the not equal output of comparator 127, the output of data redundant indicator 160 goes low and redundancy storage unit 164 ceases to load the output of 150 and retains as its output the last output of counter 150 prior to the not redundant indication from comparator 127. The count stored in redundancy count storage unit 164 goes to a multiplexer 176 through multi-line channels 179 and 180. The output of multiplexer 176 is received by multiplexer 33 through channel 72.

The output of the last shift register 104 on channel 30 is an input to a comparator 184 (FIG. 4) as well as to multiplexer 33. The other input to comparator 184 is from a background storage unit 188 through multiline channel 190. The background storage unit 188 receives a background level, which it outputs on channel 190, on multi-line channel 192. If the digital signal on line 30 is greater than the background level, the output of comparator 184 to controller 172 on line 195 goes high. Thus, the output of comparator 184 indicates if the digital signal contained in the last shift register is above a certain predetermined level i.e., above the level of the background of the medium being observed. This background can be determined by a processor or other device or be preset manually. The output of comparator 184 indicates that a digital signal of a certain group of digital signals is currently stored in the last shift register 104. This certain group includes a primary signal and a group of signals closely related thereto. Controller 172 has an output on line 198 to multiplexer 176. The signal on line 198 determines which of the inputs from redundancy count storage unit 164 appears as the output of multiplexer 176 to channel 72. The other outputs of controller 172 are lines 202 through 204, line 206 and multi-line channels 208 and 210; all are inputs to multiplexer 33 except line 206 which is connected to byte storage register 59. Line 202 is connected to the strobe input the individual IC multiplexer units within multiplexer 33 so that when the output of controller 172 on line 202 goes high the output of multiplexer 33 to each of the individual lines within channel 79 is a logic '0'. The individual integrated circuit multiplexing units within multiplexer 33 are typical 0000'four lines of input to one line of output multiplexers and receive their selection signals from controller 172 on lines 203 and 204. The timing pulse from line 37 is an input of controller 172 on line 234. The scan start pulse is an input to controller 172 on line 235 after being delayed within the shift registers so that it is received by the controller as the first digital signal of the scan becomes the output of shift register 104. The pulses on lines 234 and 235 are communicated to an address counter 240 (FIG. 9) included within controller 172. The output of the address counter 240 appears on channels 208 and 210 to multiplexer 33.

The output of controller 172 on line 206 to byte storage register 59 provides sequencing signals to byte storage register 59 to insure that the byte storage unit 59 stores and outputs the input from multiplexer 33 after the multiplexer has received the proper selection signals on lines 203 and 204. The sequencing signal on line 206 is inverted by inverter 244 which is connected to byte counter and FIFO sequencer 246 (FIG. 5) through line 248.

During the operation of the data compressor 20 the controller 172 through its address counter provides an address for each digital signal with a scan signified by the scan start pulse on line 235. The address counter is zeroed in the preferred embodiment upon the receipt of the scan start pulse and thereafter counts the pulses on line 234 which signify that data is being transferred into the memory 28. If the data is both not redundant and above the level of the background, the controller 172 will select the signal present on channel 30 as the output of multiplexer 33 when that digital signal is stored within the last shift register 104. When a train of more than four redundant signals is encountered within the stream of digital signals, the first redundant signal of the train of redundant signals is passed from channel 30 to channel 79 and loaded into byte storage register 59. The redundant signals of the train are counted and after the last of the redundant signals is received, the controller 172 directs multiplexer 176 to select channel 180 as its output via line 202 and multiplexer 33 to select channel 72, which is the output of multiplexer 176, by the proper selection signals on lines 203 and 204. After the output of redundancy storage register 164 has been loaded into byte storage register 59 subsequent to receiving the load signal on line 206, the controller 172 through line 198 causes multiplexer 176 to select the data on channel 179 as its output while maintaining the same selection signals on lines 203 and 204 and thereafter loading the signals on channel 179 into byte selector 59. During the interval between the loading of the first of the redundant signals of the train and the loading of the redundancy count the output of the controller 172 to line 202 is high which causes multiplexer 33 to output '0000'. This zero or control marker is loaded into byte storage register 59 and thereafter no further load signals are sent by controller 172 over line 206 to the register 59 until the final redundant signal is received and the count is loaded into the register 59. Thus, the train of redundant signals is eliminated from the stream of digital signals.

If the controller 172 receives a signal on line 195 from comparator 184 indicating that the digital signal stored in register 104 which is at or below the background the controller 172 through line 202 (which is channel 69 of FIG. 1) sets the output of multiplexer 33 to a logic '0000' and initiates a low pulse to register 59 so that the '0000' signal is loaded into register 59. When a signal above the background level in register 104 is detected by comparator 184, the controller 172 initiates selection signals on lines 203 and 204 and load signals on line 206 with the purpose of loading the parts of the address on channel 210 first and then on channel 208 into register 59 through multiplexer 33. Thereafter the address of the digital signal which is above the background located within register 104 is selected as the output of multiplexer 33 and loaded into register 59. Because the digital signals below the background level are not passed through to byte storage register 59 they are eliminated from the data stream. These digital signals would of course include the logic '0' signals contained within the data stream; therefor, the logic '0000' loaded into byte storage register 59 indicates during reconstruction of the data that the next signals in the data stream represent either a redundancy count or an address. The '0000' digital signal is the primary signal of the particular example described in the preferred embodiment.

TABLE I

DFFFFFFFFFFFFFFFFFFFFFFF5000000078A0000-0000000000

Assuming 48 bits of data per scan and 4 bits per digital signal, table I represents one scan of raw data. Table II shows the output of multiplexer 33 to byte storage register 59 for the raw data shown in table I.

Table II.

| Byte Number | COMPRESSED DATA | |
|---|---|---|
| | Byte | Comments |
| 1 | 0000 | Control byte indicating the next two bytes are address or redundancy count |
| 2 | 0000 | |
| 3 | 0000 | Address of 0 indicates Begin Scan |
| 4 | 1101 | Data = $D_{16}$ |
| 5 | 1111 | Data = $F_{16}$ |
| 6 | 0000 | Control Byte |
| 7 | 1001 | Most significant byte with most significant bit set indicates redundancy count. 1001010 = redundancy count of 21. |
| 8 | 0101 | |
| 9 | 0101 | Data = 5 |
| 10 | 0000 | Control byte |
| 11 | 0001 | |
| 12 | 1111 | Address of 31 |
| 13 | 0111 | Data = 7 |
| 14 | 1000 | Data = 8 |
| 15 | 1010 | Data = $A_{16}$ |
| 16 | 0000 | Control |
| 17 | 0000 | Address = 0 |
| 18 | 0000 | Start next scan. |

When the scan start pulse is received by controller 172, it commands via line 202 multiplexer 33 to output logic '0000' and a pulse on line 206 to load the logic '0000' generated by multiplexer 33 into register 59. Two further '0000' digital signals are loaded thereafter. Because the first digital signal is above the background, it is loaded in byte storage register 59. Thus, the first four bit words which are transferred by multiplexer 33 to register 59 are '0000', '0000', '0000', and '1101' (which is the digital representation for the data signal D because there are sixteen levels of grey). The controller 172 provides the proper selection signals on lines 203 and 204 and further provides the proper load signals to register 59 on line 206. The selection signals on line 203 and 204 remain the same and the next digital signal, '1111' (the digital representation for the signal F) is passed through multiplexer 33 and loaded into register 59. Prior to '1111' being loaded into register 59 the redundancy counter 150 and its associated circuits have been counting redundant signals the first F of the train of redundant signals is loaded into register 104. The data redundant indicator 160 supplies the controller 172 with a signal on line 168 which causes the controller 172 not to pass any further load pulses on line 206 to register 59.

When the last redundant signal in the train reaches register 104, the count in count storage register 164 is loaded into byte storage register 59 through multiplexers 176 and 33 by controller 172. Controller 172 first generates a logic '1' on line 202 commanding multiplexer 33 to generate the control marker '0000'. The controller 172 then selects the signals on line 180 as the output of multiplexer 176 and the signals on channel 72 as the output of multiplexer 33 (and generates the appropriate load signals to register 59) and then selects the signals on channel 179 to mutiplexer 176 while maintaining channel 72 as the output of multiplexer 33. The most significant bit of the first four bit woud of the count is a logic '1'. This bit and the next significant bit of the first four bit woud are a portion of the control marker in order that the data may be reconstructed at a latter time. The logic '1' in the most significant bit indicates that a redundancy count follows and a '0' indicates that an address follows. Because only 48 signals are in each row only six binary digits are necessary for the redundancy count and the address. Since there were 21 F's following the initial F which was loaded into register 59 the count in binary form is '010101'.

The next signal is a single 5 (represented as '0101' digitally) which is loaded into register 59 as discussed above. Because the next digital signal in the stream is '0000' the controller 172 loads a 0000 signal as the output of multiplexer 33 by generating a high signal on line 202. The next signal which is not above the background signal '0000' is a 7 which is the 32nd signal in the stream. Because the addressing system begins at 0 the address of the digital signal represented by the 7 in the raw data table I is 31. In digital representation the address is '011111'. It should be noted that the two most significant bits following the '0000' signal are '00' indicating that the address follows in the next six bits of information, of the data stream. Thus, the '0000' signal and the two most significant bits of the next four bit word form a control marker which indicates that an address follows in the next six bits of information so that the compressed data can be reconstructed when desired.

The controller 172 then selects the output of register 104 as the output of multiplexer 33 and loads the digital signal 7, '0111', into register 59. The data word 8 and the data A, represented by the binary words '1000' and '1010', respectively, are then loaded as they appear at the output of register 104 into register 59 as discussed above. A zero is the next digital signal in the stream of raw data and therefor controller 172 loads a 0000 into register 59 as discussed above. Because no further bits of information in this particular scan as shown in table I are above the background level when the scan start pulse is received on line 234 the '0000' control marker and the two most significant digits of the next word are '00' and the address is '000000'.

On reconstruction of the data the start of a new scan is indicated by the address zero. Thus, the stream of digital signals are compressed so as to eliminate a primary signal or a cluster of primary signals i.e. those signals which are not above the background are eliminated from the data stream and a control marker consisting of six bits, which in the preferred embodiment are six zeros, and an address are substituted therefore. Further, redundancies of four more are eliminated from the data stream and a control marker consisting of six bits i.e. '000010' and a six bit count of the number of redundancies has been substituted therefor. Also, the scan start pulse at the beginning of each row of data are inserted into the data stream in order that the stream as altered by the data compressor of the present invention may be reconstructed on a row by row basis in its entirety.

Figure 5:
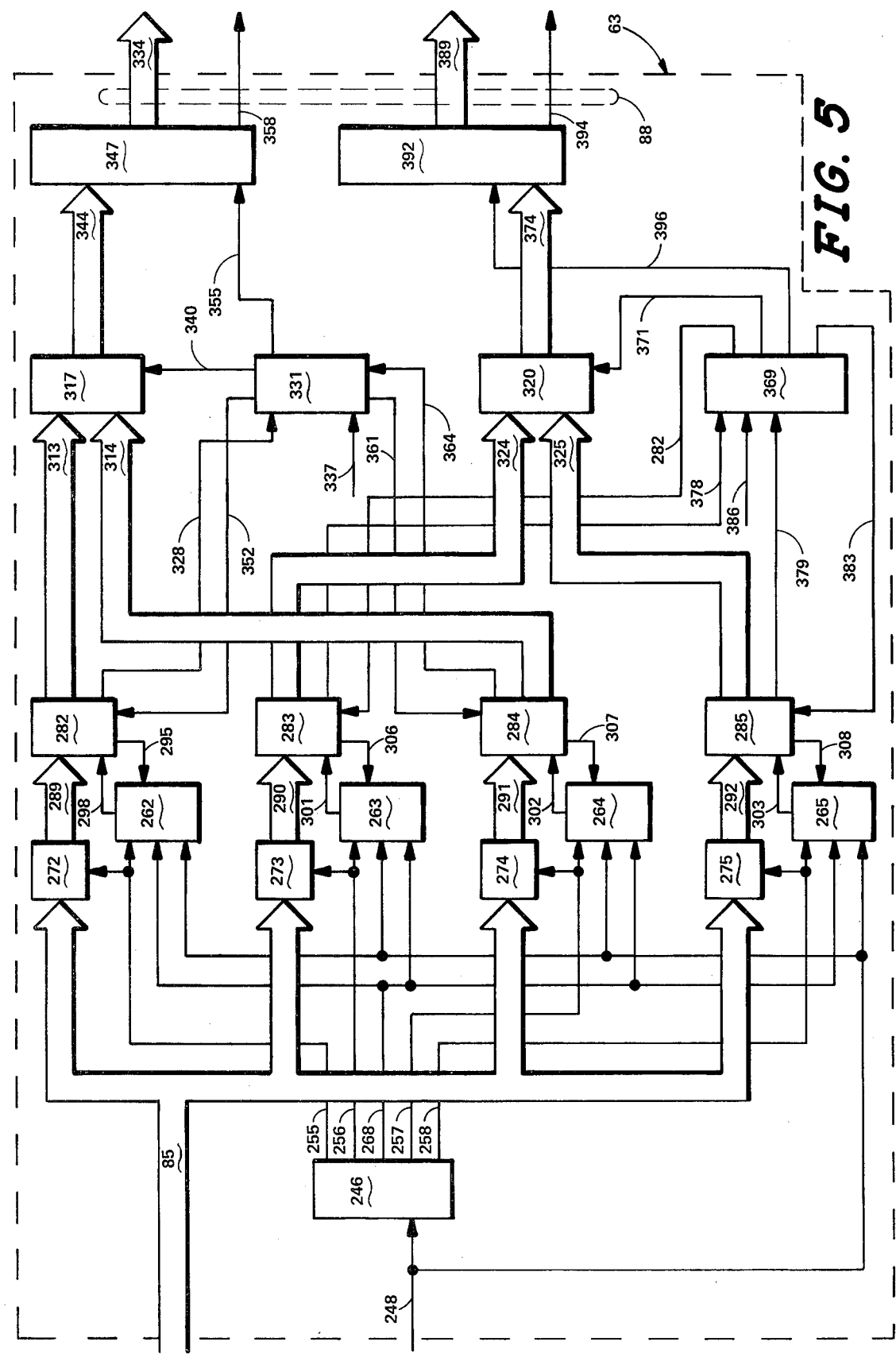
FIG. 5 is a more detailed block diagram of a portion of the associated output devices of FIG. 1.

Prior to a detailed discussion of the controller 172 and related components, a utilization of the compressed data stream on channel 85 as shown in FIG. 5 is discussed here below. The byte counter and FIFO sequencer 246 receives the inverted load pulses on line 248. A counter (not shown) within the sequencer counts the pulses on line 248 and outputs a signal to a second counter after counting six load pulses on line 248. A second counter (not shown) counts the output of the first counter within the sequencer 46 from 0 to 3 and then recycles to 0. The output of the second counter goes to the selection terminals of a decoder or demultiplexer. The demultiplexer (not shown) within sequencer 246 has its one line of input tied to a logic '1' voltage source. The four lines 255 through 258 of output each in turn have an output of a logic '1' as they are selected by the second counter. The six load signal count from the first counter is also an output from the byte counter and FIFO sequencer 246 to FIFO input controls 262 through 265 through line 268. Line 255 is connected to FIFO input control 262 and FIFO register 272. Line 256 is connected to FIFO input control 263 and FIFO register 273. Line 257 is connected to FIFO input controller 264 and FIFO register 274, and line 258 is connected to FIFO input control 265 and FIFO register 275.

Byte storage register 59 is composed of four individudal IC six bit registers with one line of channel 79, which is comprised of a four lines, connected to each of the registers. The output of the register associated with the input to which the line of channel 79 is attached is connected to a second input of the same register. The output of the second input is connected another input of the same register and so on so that as data is loaded from multiplexer 33 it is stacked so that the most significant bits all six words stored in the register 59 are in one of the individual IC registers. Same is true for the other bits of the four bit words. The output of the register 59 connected to FIFO register 272 through 275. The purpose of register 59 is to stack the four bit words or digital signals in the data stream into a 24 bit word make up of six of the four bit digital signals of the data stream. The FIFO registers 272 through 275 are adapted to receive and store a 24 bit word. Assuming that a 24 bit word has been compiled and that the count of the second counter in the sequencer 246 is zero the output to line 255 goes high which this enables FIFO register 272 stores the 24 bit word on channel 85. After another 24 bit word is compiled in register 59, the count in the second register in sequencer 246 will be 1 and line 256 goes low while lines 255, 257 and 258 remain high which enables FIFO register 273 to store the 24 bit word on channel 85. The operation continues and FIFO register 274 and 275 are also loaded with 24 bit words FIFO register 275 is then loaded with a new word and the operation continues.

Each of the FIFO registers 272 through 275 is connected to a FIFO memory 282 through 285, respectively. Each FIFO register 272 through 275 is connected to its associated FIFO memory through a multi-line channel 289 through 292, respectively. All of the FIFO control 262 through 265, all the FIFO registers 272 through 275, and all of the FIFO memories 282 through 285 are identical and a discussion of one group suffices for all.

After the 24 bit word has been stored FIFO register 272 and if the output of FIFO memory 282 on line 295 is high indicating that FIFO memory 282 is prepared to receive data, the output of FIFO control 262 to line 298 goes high. The high signal on line 298 causes FIFO memory 282 to store the 24 bit word which is present on channel 289 from FIFO register 272. The particular FIFO memory which is utilized is six, 64 word by 4-bit FIFO memories connected in parallel. Each 64-word by 4-bit FIFO memory receives four bits of the 24 bit word from FIFO register 272. The output of FIFO memory 282 to line 295 goes low after the 24 bit word is stored in the first location of the memory. The 24 bit word is moved into the next location in the memory by the control circuits of the memory and the output to line 295 goes high again. Meanwhile the output of FIFO control 262 to line 298 goes low. The FIFO memory will automatically move the 24 bit words toward its output until all the 24 bit words within the memory are stacked as received from the last location in the memory one 24 bit word at a time back toward the input. In other words, the 24 bit word which has been present in the memory the longest is located at the last memory location in the memory adjacent to the output of the FIFO memory and the 24 bit word which is stored in the memory the next longest is in the second memory location from the output of the FIFO memory.

(The 4 × 64 bit FIFO memories being utilized are 3341 serial memories.) The other FIFO control 263 through 265 are connected to FIFO memories 283 through 285 through lines 301 through 303, respectively. The FIFO controls 263 through 265 receive signals from their associated FIFO memories 283 through 285 on lines 306 through 308, respectively. Lines 301 through 303 serve the same function for their associated FIFO control and FIFO memories as line 298 does for FIFO control 262 and FIFO memory 282. Also, line 295 serves the same function for FIFO control 262 and FIFO memory 282 s lines 306 through 308 serve for their respective FIFO controls and memories. The 24 bit words present at the output of FIFO memories 282 and 284 are connected through multi-line channels 313 and 314, respectively, to the inputs of multiplexer unit 317. Another multiplexer 320, which is identical to multiplexer unit 317, receives the outputs of FIFO memories 283 and 285 through multi-line channels 324 and 325, respectively.

After a digital signal is loaded to the last location in FIFO memory 282 its output on line 328 to output control 331 goes high. When the computer or other storage device 45 is prepared to receive data on the multi-line channel 334 a signal is passed to controller 331 on line 337. The selection inputs of the individual multiplexers contained within multiplexer unit 317 are connected to line 340 which allows control 331 to select either channel 313 and 314 as the output of multiplexer unit 317 to multi-line channel 344. The 24 bit word transferred in parallel on channel 344 is passed through driver unit 347 wherein an individual driver (amplifier) is provided for each line of the channel. The 24 bit word is received by storage unit 45 from channel 334.

If channel 313 is selected as the output and the signal on line 337 indicates that the storage means 45 has accepted the output on channel 334, the output of control 331 to FIFO memory 282 on line 352 goes high and then low, the next 24 bit word stored in FIFO memory 282 is shifted to the output of memory 282 and appears on channel 313. The output of memory 282 to line 320 goes high after the next 24 bit word is transferred to the output of the memory. Control 331 also has an output to line 355 to driver unit 347 which after implification appears on line 358 connected to storage means 45. The signals on line 355 which is generated by control 331 indicate to the storage means input buffers that the data on channel 334 is to be accepted.

In addition, control 331 has an output through line 361 to FIFO memory 284 and has an input on line 364 from FIFO memory 384. Lines 361 and 364 serve the same functions for their associated FIFO memory 284 as lines 328 and 352, respectively, for their associated FIFO memory 282.

Multiplexer unit 320 has its selection inputs connected to output control 369 through line 371. Control 369 is identical to control 331 and the above functional description with regard to control 331 applies equally to control 369. The selection signals from control 369 on line 371 determine which of the channels 324 or 325 is passed through multiplexer unit and becomes the output to multi-line channel 374. Control 369 receives inputs from FIFO memory 283 and 285 on lines 378 and 379, respectively, and has outputs to FIFO memories 283 and 285 on lines 282 and 283, respectively. Also the control 369 receives an indication concerning the status of the storage means 45 on line 386. Those indications are that the storage means is prepared to accept digital signals on channel 374 transferred to channel 389 after amplification within driver unit 392. Control 369 provides the storage means 45 with an indication through line 394 that the digital signals on channel 389 should be accepted. Line 394 is connected through driver unit 392 and line 396 to control 369. Other status signals and indications concerning the data compressor 20, byte storage register 59, and the FIFO memory 63 can also be passed through driver units 347 and 392, as desired.

In operation, assuming that FIFO memory 282 contains the next 24 bit word to be loaded into the storage means 45 and the signal on line 328 is high, control 331 selects through line 340 the signals on channel 313 as the output of multiplexer 317 to channel 344. After channel 313 has been selected, control 331 sends a signal to the storage means through line 355 to indicate that the correct data has been selected and can be stored. After the data is stored the storage means causes a signal to be present on line 337 indicating that the data is stored, and control 331 causes its output to line 352 to go high which causes the next 24 bit word in FIFO memory 282 to move to the output thereof. At the same time control 369 through line 371 causes multiplexer unit 320 to select the signals on channel 324 from FIFO memory 283 as its output to channel 374. After proper data i.e. signals on channel 324 is selected control 369 so indicates to the storage means 45 on line 396. After the digital signals which are outputted by FIFO memory 283 are accepted by storage means 45 and the storage means so indicates on line 386, control 369 causes its output to line 282 to go high which causes the next 24 bit word in FIFO memory 283 to promulgate to the output thereof. Control 331 through line 340 causes multiplexer unit 317 to select the output of FIFO memory 284 on channel 314 as its output to channel 344 and sends a signal so indicating to storage means 45 through line 355. After the data is accepted it is so indicated on line 337 to control 331. Control 331 causes line 361 to go high which causes the next 24 bit word in FIFO memory 284 to promulgate to the output thereof and control 331 selects the output of FIFO memory 282 as the output of multiplexer unit 317 and so indicates on line 355. Control 369 has selected the digital signals on channel 325 from FIFO memory 285 as the output of multiplexer unit 320 and so indicates on line 369 to storage means 45. Control 369, after receiving an indication that the data is accepted by the storage means on line 386, causes line 383 to go high which in turn causes the next 24 bit word in FIFO memory 285 to promulgate to the output thereof. Control 369 selects the digital signals on channel 324 as the output of multiplexer unit 320.

It can be appreciated by those skilled in the art that the flow of data through FIFO memory 63 is such that the digital signals are transferred from the byte storage register 59 through the FIFO registers 272 through 275, FIFO memories 282 through 285, and multiplexer units 317 and 320 in order that the 24 bit words which appear on channels 334 and 389 are in the same identical serial order as received by the byte storage register 59. Also it can be appreciated that the individual 4 bit words (digital signals) within the data stream must be kept in the same order as they are generated by or promulgated from the multiplexer 33 within the data compressor 20 in order that the data stream may be reconstructed at a later time. In summary, 4 bit words are generated or transferred through the data compressor 20 as discussed above and are loaded into byte storage register 59. The output of the byte storage regiser 59 is a 24 bit word made up of six of the four bit words from the data compressor. These 24 bit words are transferred in parallel to one of the FIFO registers 272 through 275 wherein they are stored. The particular register to which the word is moved is dependent on a counter within the byte counter and FIFO sequencer 246. For example, if a 24 bit word has just been stored within FIFO register 273 the next 24 bit word transferred from the byte storage register 59 is stored in FIFO register 274. The 24 bit words are transferred in parallel into the FIFO memories 282 through 285 from the FIFO storage registers. The FIFO memories act as elastic storage devices in that they allow for limited periods of time data to be accumulated therein if the data compressor is unable to compress the data being received because of the lack of primary signals and redundancies. Thus, if the digital signals within the data stream are both above the background and not redundant and are being generated at a rate faster than the storage means 45 can accept data, the number of 24 bit words stored within the FIFO memories increase and at a later time when redundancies and signals below the background are again occurring within the data stream the number of 24 bit words within the FIFO memories begin to decrease. The 24 bit words within the FIFO memories are transferred to the storage means 45 in such a way that the sequence of the 24 bit words remains undisturbed. Assuming the next 24 bit word to be transferred is located at the output of FIFO memory 283, it is transferred through multiplexer unit 320 and stored within the storage means 45. The next 24 bit word to be transferred is located at the output of FIFO memory 284 and is transferred through multiplexer unit 317 to the storage means. Next, the 24 bit word located at the output of FIFO memory 285 is transferred through multiplexer 320 to the storage means followed by the 24 bit word appearing at the output of FIFO memory 282 which is transferred through multiplexer 317. The particular utilization of the output of the compressor 20 shown in FIG. 5 is by way of example only and other utilizations are possible, of course.

Figure 6:
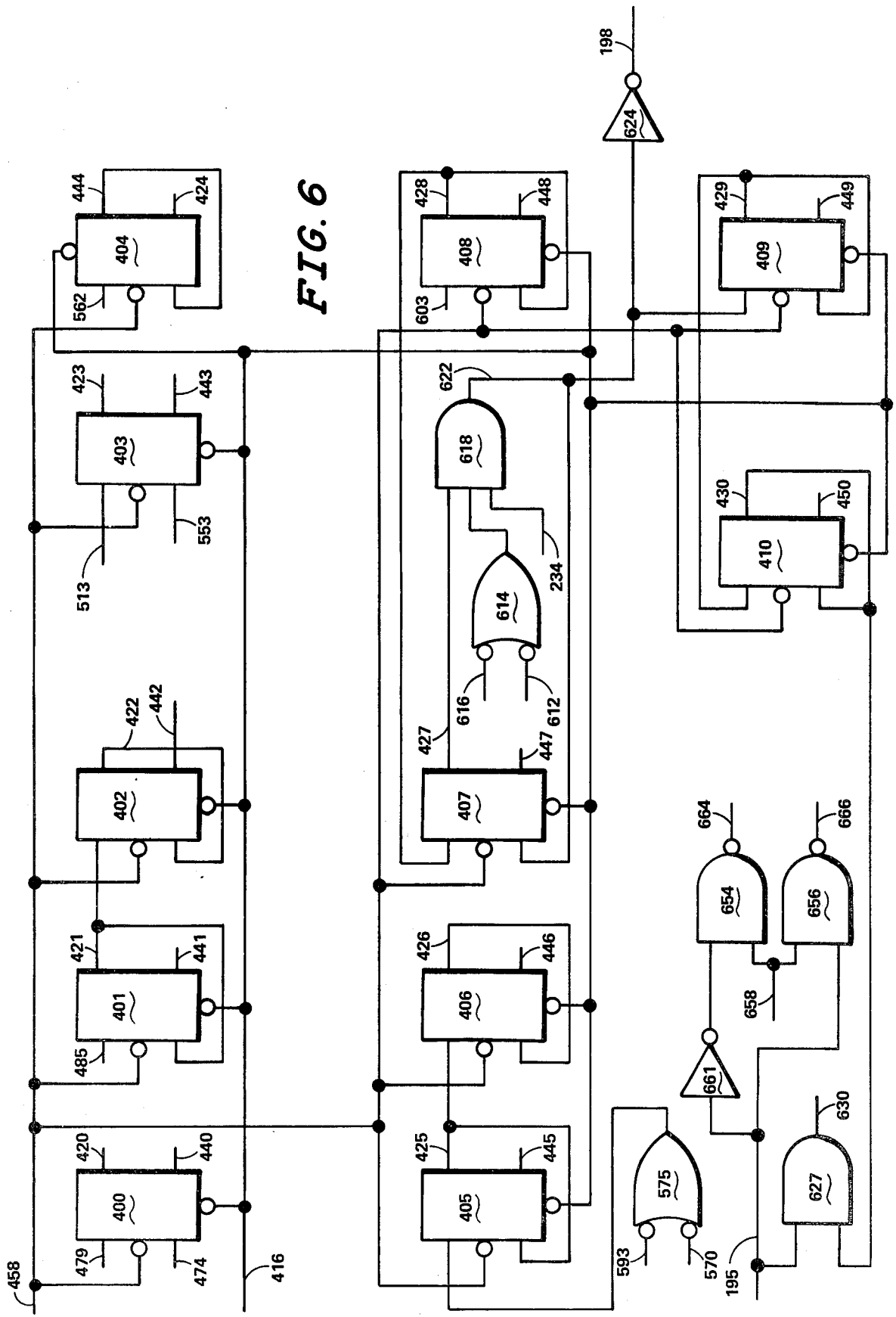
Figure 7:
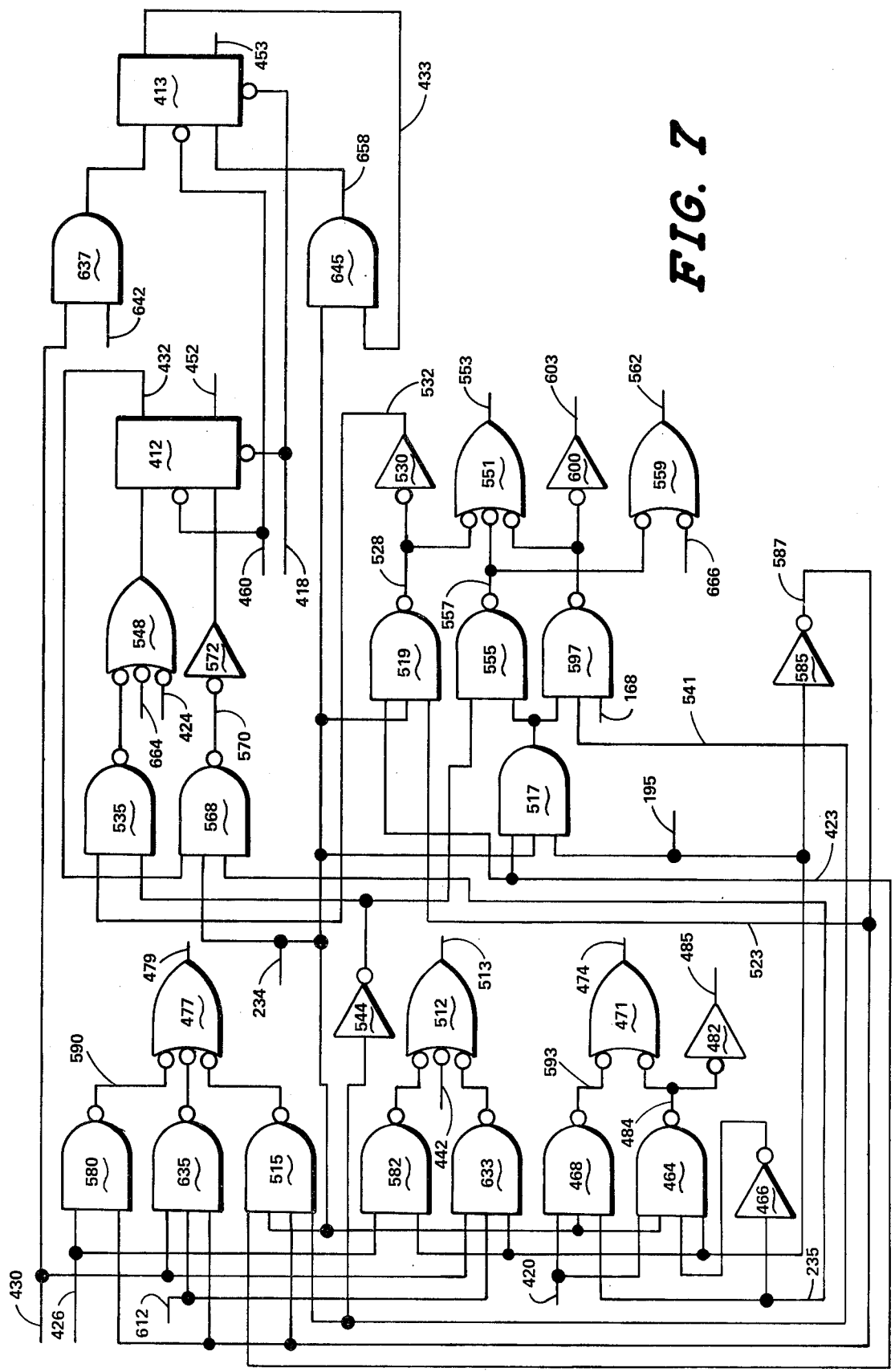

FIGS. 6, 7 and 8 taken together comprise the controller 172 of FIG. 4. J-K flip-flops 401 through 410 (FIG. 6) and J-K flip-flops 412 and 413 (FIG. 7) are the state machines of the preferred embodiment of the present invention. It should be noted that standard clocking and clear techniques are used throughout. (The flip-flops utilized are negative edge triggered J-K flip-flops with a present function). When the signal on line 416 (FIG. 6) and line 418 (FIG. 7) goes low, the flip-flops 400 through 410, 412 and 413 are preset with their outputs to lines 420 through 430, 432, and 433, respectively, high and their outputs to lines 440 through 450, 452, and 453, respectively low. A 50 nanosecond clock pulse is applied to the clock inputs of all of the J-K flip-flops through line 458 (FIG. 6) and line 460 (FIG. 7).

Assuming that the controller has been preset to its initial conditions and is prepared to control the flow of data through the data compressor 20, what follows is a discussion of the operation of the controller 172. The scan start pulse on line 235 (FIG. 2) is applied to NAND gate 464 through an inverter 466. The scan start pulse is passed through the shift registers 100 through 104 so that it is delayed as described above. The data timing pulses on line 234 are also received by NAND gate 464. An output of flip-flop 400 (FIG. 6) is connected through line 420 to NAND gate 464 and NAND gate 468 (FIG. 7). The final input to NAND gate 464 is the signal from comparator 185 on line 195. The scan start pulse on line 235 and the data timing pulse on line 234 are also connected to NAND gate 468.

Assuming that at sometime the output of NAND gate 477 has gone high (to be discussed herebelow) and the output of flip-flop 400 to line 420 is high, when the next data timing pulse is received by the controller on line 234 the output of NAND gate 468 goes low because all of its inputs are high. If a scan start pulse is not received on line 235 the output of NAND gate 464 goes low. The low output of either NAND gate causes the output of NAND gate 471 (shown as an OR gate with inverted inputs which are referred to herein as NAND gates) to go high which during the next transition of the clock pulse from high to to low causes flip-flop 400 to have a high output to line 440 and a low output to line 420. Assuming that the scan start pulse was not received and, the digital signal in register 104 is above the background (line 195 is high) the low output of NAND gate 464 causes the output of inverter 482 to which it is connected to go high. The high output of inverter 482 is connected through line 485 to the K input of flip-flop 401. During the next high to low transition of the clock pulse on line 458 the outputs of flip-flop 401 to lines 421 and 441 go high and low, respectively. The output of NAND gate 464 to line 484 is also connected to an input of NAND gate 486 (FIG. 8). The output of NAND gate 486 to line 206 is high. Line 206 is connected to byte storage register 59 and to inverter 244 of FIG. 4 as discussed above and carries the load signal. The selection signals on 203 and 204 are both low and the output of counter 500 (FIG. 9) is loaded into the byte storage register 59.

The low output of flip-flop 401 after the next clock pulse is connected to NAND gate 490 through line 441. Because one of the inputs to NAND gate 490 is low it's output to line 203 is high. Also, as will be discussed hereinafter, the output of NAND gate 494 is low. The low output of flip-flop 401 to line 441 causes NAND gate 490 to go high which in turn causes a selection of counter 502 (FIG. 9) as the output of multiplexer 33. The high output of flip-flop 401 to line 421 is connected to NOR gate 505. Because one of the inputs to NOR gate 505 is high its output which is connected through line 508 to NAND gate 486 goes low causing the output of NAND gate 486 to go high. This high signal one line 206 causes byte storage register 59 to load the output of counter 502. Line 421 is also connected to the K input of flip-flop 402 and to its own J input which means that during the next high to low transition of clock pulse the output of flip-flop 401 to line 421 goes low and the output of flip-flop 402 to line 422 goes high. Correspondingly the output of flip-flop 401 to line 441 goes high and the output of flip-flop 402 to line 442 goes low during the same clock pulse.

The low output of flip-flop 402 to line 442 is connected to NAND gate 512 (FIG. 7), NAND gate 490 and NAND gate 494 (FIG. 8). Also, line 422 is connected to the J input of flip-flop 402 and an input of NOR gate 505. Thus, when the outputs of flip-flop 402 to lines 422 and 442 go high and low, respectively, the outputs of NAND gates 486, 490 and 494 go high. This causes the digital signal present in shift register 104 to be selected by multiplexer 33 and loaded into byte storage register 59. Because the output of flip-flop 402 to NAND gate 512 is low, the output of NAND gate 512, which is connected to the K input of flip-flop 403 through line 513 is high. During the next high to low transition of the clock pulse the outputs of flip-flop 403 to lines 423 and 443 go high and low, respectively.

The high output of flip-flop 403 to line 423 goes to AND gate 515, and gate 517, NAND 519 (FIG. 7) and NAND gate 521 (FIG. 8). The other input to NAND gate 521 is the data timing pulse on line 234. When the data timing pulse is received by NAND gate 521 its output goes low which causes the outputs of NAND gates 486, 490 and 494 to go high. The high outputs of NAND gates 490 and 494 cause a multiplexer to select the four bit word stored in register 104 as its output and the high output of NAND gate 486 causing the selected output of the multiplexer 33 to be loaded into byte storage register 59. However, if the signal on line 523 is high indicating that the data is below the level of the background as determined by comparator 184, the output of NAND gate 519 (FIG. 7) to line 528 goes low during the data timing pulse which causes NAND gate 526 (FIG. 8) to go high. The multiplexer 33 generates a '0000' digital signal as its output despite the selection signals provided by NAND gates 490 and 494. The high signal on line 206 causes the byte storage register 59 to store the '0000' output of the multiplexer. Line 528 is connected to NAND gate 531 and through an inverter 530 and line 532 to NAND gate 535.

If the data is below the background level as indicated on line 195 all of the inputs to NAND gate 515 are high. Its output goes low which causes the output of NAND gate 477 to flip-flop 400 to go high which in turn causes flip-flop 400 to have its output to line 420 to go high during the next high to low transition of the clock pulse. The logic then continues as discussed above in connection with flip-flop 400.

If on the other hand the count in counters 500 and 502 had been 47, NAND gate 515 remains high because its input from NAND gate 538 (FIG. 9) is low. NAND gate 538 is connected through line 541 to counters 500 and 502 and goes low only when the count in the counters is 47. When the count equals 47 NAND gate 535 (FIG. 7) goes low because it is connected to NAND gate 538 through inverter 544 and through inverter 530 to NAND gate 519 which is low because the data is below the background level. The low output of NAND gate 535 causes NAND gate 548 to go high which during the next high to low transition of the clock pulse causes the output of flip-flop 412 to lines 432 and 452 to go high and low, respectively. The low output of NAND gate 519 is also applied to an input of NAND gate 551 which causes NAND gate 551 to go high. The high output of NAND gate 551 is applied through line 553 to the J input of flip-flop 403 which causes the output of a flip-flop 503 to lines 423 and 443 to go low and high respectively at the same time as setting of flip-flop 412 as discussed above. Also as discussed above the low output of NAND gate 519 causes multiplexer 33 to generate a '0000' output.

AND gate 517 goes high if the digital signal in shift register 104 is greater than the background and the output of flip-flop 403 to line 423 is high and the data timing pulse is received on line 234. If the count in counters 500 and 502 is equal to 47 the output of NAND gate 555 to line 557 goes low. The output of NAND gate 555 is connected through line 557 to NAND gate 551 and NAND gate 559. The high output of NAND gate 551 causes flip-flop 403 to flip-flop as discussed above and the output of NAND gate 559 to go high. The output of NAND gate 559 is connected through line 562 the J input of flip-flop 404 which causes the output of flip-flop 404 to line 424 and 404 to go high and low, respectively. The high output of flip-flop 404 on line 424 is connected to NAND gate 526 through inverter 565 and the high output of NAND gate 526 (FIG. 8). The low output of inverter 565 causes multiplexer 33 output '0000' to byte storage register 59. The output of inverter is also connected to NAND gate 486 which causes the zeros being outputted by multiplexer 33 to be loaded into byte storage register 59. The low output of flip-flop 404 to line 424 causes NAND gate 548 (FIG. 7) to go high which causes flip-flop 512 to alter its outputs during the next high to low transition of clock pulse so that its output to line 532 is high and its output to line 552 is low. At the same time, the outputs of flip-flop 404 to lines 424 and 444 go low and high, respectively because the high output on line 444 is connected to the K input thereof.

Line 432 is connected to an input of NAND gate 568 When the scan start pulse on line 235 and the data timing pulse on line 234 are received by NAND gate 568 its output goes low. The output of NAND gate 568 is connected through line 570 to inverter 572, NAND gate 575 (FIG. 6), NAND gate 526, and NAND gate 486 (FIG. 8). NAND gates 486 and 526 go high which loads '0000' into the byte storage register as discussed above. The output of inverter 572 is connected to the J input of flip-flop 412, and the output of NAND gate 575 is connected to the K input of flip-flop 405. During the next high to low transition of the clock pulse, the output of flip-flop 412 to line 452 goes high and to line 432 goes low, and the output of flip-flop 405 to line 425 goes high and its output to line 445 goes low. Line 445 is connected to an input of NAND gate 526 and the low signal present thereof causes the output of NAND gate 526 to go high which in turn causes multiplexer 33 to generate a '0000' signal at its output. The output of flip-flop 405 is connected to NOR gate 505 through line 425. The high output of flip-flop 405 to line 425 causes NOR gate 505 to go low which in turn causes NAND gate 486 to go high.

The high output of NAND gate 486 results in the '0000' of multiplexer 33 being loaded into byte storage register 59. Line 425 is also connected to the J input of flip-flop 405 and the K input of flip-flop 406. During the next high to low transition of the clock pulse on line 458 the output of flip-flop 405 to line 425 goes low as does the output of flip-flop 406 to line 446. Correspondingly the outputs of flip-flops 405 and 406 to lines 445 and 426 go high. Line 426 is connected to the J input of flip-flop 406 and to NAND gates 580 and 582 (FIG. 7), and the line 446 is connected to NAND gates 490 and 494 (FIG. 8). The low output of flip-flop 406 to line 446 causes NAND gates 490 and 494 to go high which in turn causes the data stored within shift register 104 (FIG. 2) to be selected as the output of multiplexer 33. The high output to line 426 causes NOR gate 505 to go low and NAND gate 486 to go high loading the selected output of multiplexer 33 into byte storage register 59.

However, if comparator 184 (FIG. 4) indicates on line 195 through inverter 585 and line 587 that the data contained within shift register 104 is not above the background level, NAND gate 580 (FIG. 7) goes low because the other input to NAND gate 580 is high from line 426. This low output of NAND gate 580 is connected through line 590 to NAND gate 477 and NAND gate 526 (FIG. 8). The low output of NAND gate 580 applied to an input of NAND gate 526 causes the output of NAND gate 526 to go high which in turn causes multiplexer 33 to generate zeros at its output regardless of the selection signals on lines 203 and 204 from NAND gates 490 and 494, respectively. The low output of NAND gate 580 also causes the output of NAND gate 477 to go high which in turn causes flip-flop 400 to output high signal to line 420 and a low signal to line 440 after the next high to low transition of clock pulse as discussed above. The operation of the controller then proceeds as described above. Flip-flop 406, because line 426 is connected to its J input, during that high to low transition of the clock pulse changes its output to line 426 from high to low and its output to line 446 from low to high.

If the output of flip-flop 406 to line 426 is high and the data is above the background level as indicated on line 195 from comparator 184, NAND gate 582 (FIG. 7) goes low which causes the output of NAND gate 512 to go high. The high output of NAND gate 512 applied to the J input of flip-flop 403 through line 513 causes, during the next high to low transition of the clock pulse, the output of flip-flop 403 to line 423 to go high and to line 443 to go low. The controller then operates as discussed above.

If the scan start pulse is received while the output of flip-flop 400 to line 420 is high the output of NAND gate 468 to line 593 goes low. Line 593 is connected to NAND gate 575 (FIG. 6) and NAND gates 486 and 526 (FIG. 8). The low output causes all three NAND gates to go high. Thus, multiplexer 33 generates a '0000' output which is loaded into byte storage register 59 and during the next high to low transition of the clock pulse flip-flop 405 outputs a high signal to line 425 and a low signal to 445.

Further, if while the output of shift register 403 to line 423 is high and the output to line 443 is low, the count in counters 500 and 502 (FIG. 9) is less than 47 as indicated by NAND gate 538, and the data is above the background, the output of AND gate 517 goes high during the next data shift pulse on line 234. The output of AND gate 517 is connected to NAND gates 555 and 597. If the signal from data redundant indicator 160 through line 168 is high NAND gate 597 goes low. The output of NAND gate 597 is connected to NAND gate 551 and inverter 600. The output of inverter 600 is connected through line 603 to the K input of flip-flop 408 (FIG. 6). Thus, flip-flops 403 and 408 flip-flop during the next high to low transition of the clock pulse. Flip-flop 408 has, after the clock pulse, its output to line 428 high and to line 448 low.

If redundancy is not detected and, therefore, line 168 does not go high, the data is above the background level and the row count is less than 47, the output of flip-flop 403 to line 423 remains high and, therefore, the output of NAND gate 521 (FIG. 8) goes low when a data timing pulse is received on line 234 which causes the digital signal present in shift register 104 to be stored in byte storage register 59. The output of NAND gate 521 goes to NAND gates 486, 490 and 494. As new digital signals are moved into shift register 104 they are loaded into byte storage register 59 in series until one of the three conditions set forth above is not present.

If the data redundant signal is received on line 168 and flip-flop 408 has its output to line 428 high (as discussed above). Line 428 is connected to the K input of flip-flop 407 and to NOR gate 606 (FIG. 8). The output of NOR gate 606 is connected to NAND gate 486. The high output of flip-flop 408 to NOR gate 606 through line 428 causes the NOR gate to go low which in turn causes NAND gate 486 to go high. This of course generates the load signal as discussed above. The high signal generated by flip-flop 408 is connected through line 448 to NAND gate 526. The high signal on line 448 causes NAND gate 526 to go high which in turn causes multiplexer 33 to generate a '0000' control marker at its output which is then loaded into the byte storage register. Because the K input of flip-flop 407 has a high signal applied thereto, during the next high to low transition of the clock pulse the output of flip-flop 407 to line 427 goes high and its output to line 447 goes low. At the same time the output of flip-flop 408 to line 448 goes high and its output to line 428 goes low because line 428 is also connected to the J input of flip-flop 408.

NAND gate 610 (FIG. 9) is connected to counters 500 annd 502 (FIG. 9) in such a way that its output goes low when the count contained in counters 500 and 502 is equal to 46. The output of NAND gate 610 is connected through line 612 to NAND gate 614 (FIG. 6). The other input to NAND gate 614 is the data redundant (equal) pulse from comparator 127 on line 144 which has been delayed by 4 data timing pulses. The data redundant pulse is connected to NAND gate 614 through line 616. The output of NAND gate 614 is connected to AND gate 618. The other inputs to AND gate 618 are lines 427 and 234. Line 234 connects AND gate 618 to the data timing pulse. The output of AND gate 618 is connected through line 622 to the J input of flip-flop 407, the K input of flip-flop 409, and inverter 624. The output of inverter 624 is connected to line 198 which in turn connects the output of the inverter to the multiplexer unit 176 (FIGS. 3 and 4). Line 198 is also connected to NAND gates 486 and 494 (FIG. 8). Because the output of flip-flop 407 to line 427 is high and the data timing pulse on line 234 is periodically high, if either input to NAND gate 614 goes low while the data timing pulse to AND gate 618 is high the output of AND gate 618 goes high. The output of inverter 624 goes low which causes the output of NAND gates 486 and 494 to go high. This in turn causes multiplexer 33 to select the output of multiplexer 176 as its input and results in the output of a load signal to line 206. Line 198 also causes multiplexer 176 to select one of its inputs (to be discussed in detail hereinafter). The input selected by multiplexer 176 is loaded into byte storage register 59.

The high output of AND gate 618 to flip-flop 407 causes it during the next high to low transition of the clock pulse to alter its output so that its output to line 427 is low and line 447 is high. The low output to line 427 causes AND gate 618 to go and remain low. Thus, the output of inverter 624 is high which selects the other input of multiplexer 176. At the same time as the output to line 427 goes low and output of flip-flop 409 to line 429 goes high and to line 449 goes low. Line 429 is connected to the K input of flip-flop 410, the J input of flip-flop 409, and input of NOR gate 606 (FIG. 8). The output of NOR gate 606 goes low and the output of NAND gate 486 goes high. Thus, the other input of multiplexer 176 is selected by inverter 624 and is loaded into byte storage register 59. The low output of flip-flop 409 is connected to NAND gate 494. During the next high to low transition of clock pulse, the output of flip-flop 410 to line 430 goes high and the output to line 450 goes low, and conversely the output of flip-flop 409 to line 429 goes low and the output to line 449 goes high.

Line 450 connects flip-flop 410 to NAND gates 490 and 494 (FIG. 8). Because the output of flip-flop 410 to line 450 is low NAND gates 490 and 494 go high which causes multiplexer 33 to select the output of shift register 104 as its output. Line 430 is connected to the J input of flip-flop 410 and an input of AND gate 627. The output of AND gate 627 is connected through line 630 to an input of NOR gate 606 (FIG. 8). If the data contained within shift register 104 is above the background level, line 195 from comparator 184 is high. Since as discussed above line 430 is high, AND gate 627 goes high which causes NOR gate 606 to go low which in turn causes the data to be loaded into byte storage register 59 as discussed above. However, if the data is not above the background AND gate 627 remains low and the data is not loaded into the byte storage register 59.

Line 430 connects flip-flop 410 to NAND gates 633 and 635, and AND gate 637 (FIG. 7). The other input to AND gate 637 is from NAND gate 610 (FIG. 9) through inverter 640 and line 642. If the count in counters 500 annd 502 is equal to 46 AND gate 637 is high, and during the next high to low transition of the clock pulse the output of flip-flop 413 to line 433 goes high and its output to line 453 goes low, because AND gate 637 is connected to the K input of the flip-flop. The toggling of flip-flops 413 is simultaneously with the toggling of flip-flop 410. The output of NAND gate 610 is also connected through line 612 to NAND gates 633 and 635. Line 195 is connected to an input of NAND gate 633 and to an input of NAND gate 635 through inverter 585 and line 587. If the count in counters 500 and 502 is not equal to 46 and the data is above the background, NAND gate 633 goes low which causes the output of NAND gate 512 to go high. The output of NAND gate 512 is applied through line 553 to the J input of flip-flop 403 as discussed above. The operation of the controller then proceeds as discussed above in connection with flip-flop 403. If the data is not above the background level NAND gate 635 goes low and NAND gate 477 goes high. The high output of NAND gate 477 is applied to the K input of flip-flop 400 through line 479, and the logic proceeds from that point as discussed above.

If AND gate 637 is high (with the count equal to 46) and the outputs of flip-flop 413 have toggled as discussed above, the logic proceeds as follows. Line 433 is connected to an input of AND gate 645 and NAND gate 647 (FIG. 8). The other input to NAND gate 647 is the data timing pulse on line 234. The output of NAND 647 is connected through line 650 to NAND gate 490 and 494 so that, when the output of flip-flop 413 to line 433 is high and the data timing pulse is present on line 234, NAND gate 647 goes low and NAND gates 490 and 494 go high. The output of AND gate 645 is connected to the J input of flip-flop 413 and NAND gates 654 and 656 (FIG. 6) through line 658. The output of comparator 184 is connected through line 195 to NAND gate 656 and through an inverter 661 to NAND gate 654. The output of NAND gate 654 is connected through line 664 to an input of NAND gate 526 (FIG. 8) and an input of NAND gate 548 (FIG. 7). Thus, if the data is not above the level of the background, NAND gate 654 goes low which causes NAND gate 526 to go high which in turn causes multiplexer 33 to generate a '0000' output. Also flip-flop 413 toggles during next clock pulse. Line 658 is also connected to an input of NOR gate 505. The high input from line 658 to NOR gate 505 causes the NOR gate to go low which in turn causes NAND gate 486 to go high which causes the output of multiplexer 33 to be loaded into byte storage register 59.

NAND gate 656 is connected through line 666 to NAND gate 559 (FIG. 7). When the next data shift pulse is received on line 234, the AND gate 645 goes high. NAND gate 656 goes low, if the data is above the background, and NAND gate 559 goes high which causes flip-flop 404 to toggle as discussed above. At the same time NOR gate 505 goes low generating and NAND gate 486 goes high, and because NAND gates 490 and 494 are high the data contained within shift register 104 is loaded into byte storage register 59.

If NAND gate 654 goes low, flip-flop 412 exchanges outputs at the same time as flip-flop 413. If NAND gate 656 goes low, flip-flop 404 exchanges outputs simultaneously with flip-flop 413. The logic then proceeds from either flip-flop 412 or 404 as discussed above.

As shown in FIG. 9, the scan start pulse 235 is connected through an inverter 668 to the clear and load terminals of counters 500 and 502, respectively. The data timing pulse is connected through line 670 to the count input of counter 502. The carry output of counter 502 is connected to the count inputs of counter 500. The data inputs of counter 500 are tied to ground through line 672. The three most significant data inputs of counter 502 are connected through line 674 to ground and the least significant bit put of counter 502 is connected through line 677 to a logic 1 voltage present on terminal 679. Due to the length of the scan start pulse on line 235 it was necessary within this particular environment that the least significant bit of the counter to be set to one because the first two data timing pulses would be masked by the load indication created by the begin scan pulse on line 235. The data timing pulse present on line 670 slightly precedes the data timing pulses connected to the remainder of the controller 172 in order that the counters may complete their operation prior to the address provided by counters 500 and 502 being loaded into byte storage register 59. The output of counger 502 goes through lines 682 through 685 which make up channel 208 (FIG. 4) and are connected to multiplexer 33. The two least significant bits of counter 500 are connected through lines 687 and 688 to multiplexer 33. Lines 687 and 688 comprise channel 210 (FIG. 4). The three most significant bits of output data of counter 502 on lines 683 through 685 and line 688 from counter 500 are connected to NAND gate 610 in order that NAND gate 610 goes low when the count present in counters 500 and 502 is equal to 46. Counters 500 and 502 are connected through lines 682 through 685 and line 688 to NAND gate 538 so that NAND gate 538 goes low when the count in present counters 500 and 502 is equal to 47. Thus, individualized addresses are assigned to each digital signal within a scan.

As shown in FIG. 3, redundancy counter 150 includes counters 692 and 694. Line 144 from comparator 127 is connected to the count input of counter 692. The carry output of counter 692 is connected through line 697 to the count input of counter 694. The clear inputs of counters 692 and 694 are connected to the not equal output of comparator 127 through line 146. The data outputs of counter 692 and the two least significant bits of counter 694 are connected to redundancy count storage unit 164 and data redundant indicator 160. When the data redundant indicator 160 indicates that at least four successive digital signals in the data stream are redundant by causing line 168 to go high, redundancy count storage unit 164 loads the count present in counters 692 and 694. The data redundant signal on line 168 is applied to the load input of unit 164 through an inverter 700. Thus, as long as the data redundant indicator detects and determines that successive signals in the data stream are redundant the count present in counters 692 and 694 is loaded into unit 164 and appears at the output thereof. When the data redundant signal on line 168 goes low indicating that the series or train of redundant signals has terminated, unit 164 stops loading the output of counters 692 and 694 and stores the count of the counters prior to the data redundant signal on line 168 going low. Counters 692 and 694 are during the next clock pulse reset to zero. Counters 692, 694 and unit 164 receive clock pulses on line 702.

Multiplexer 176 has 6 of its 8 inputs connected to the outputs of unit 164 so that multiplexer 176, which is a eight lines of input to four lines of output multiplexer, outputs the least significant bits from counter 692 when the selection signal from controller 172 on line 198 is high. When the signal on line 198 is low the data from unit 164 which represents the count of counter 694 are the two least significant bits of data. The most significant bit of data selected by line 198 is tied to a logic '1' present on terminal 705 and the next most significant bit of data is connected to ground through line 707. Thus, while line 198 is low the most significant bit of the output of multiplexer 176 is high, the next most significant bit is low, and the two least significant bits represent the count supplied to unit 164 from counter 694.

Figure 10:
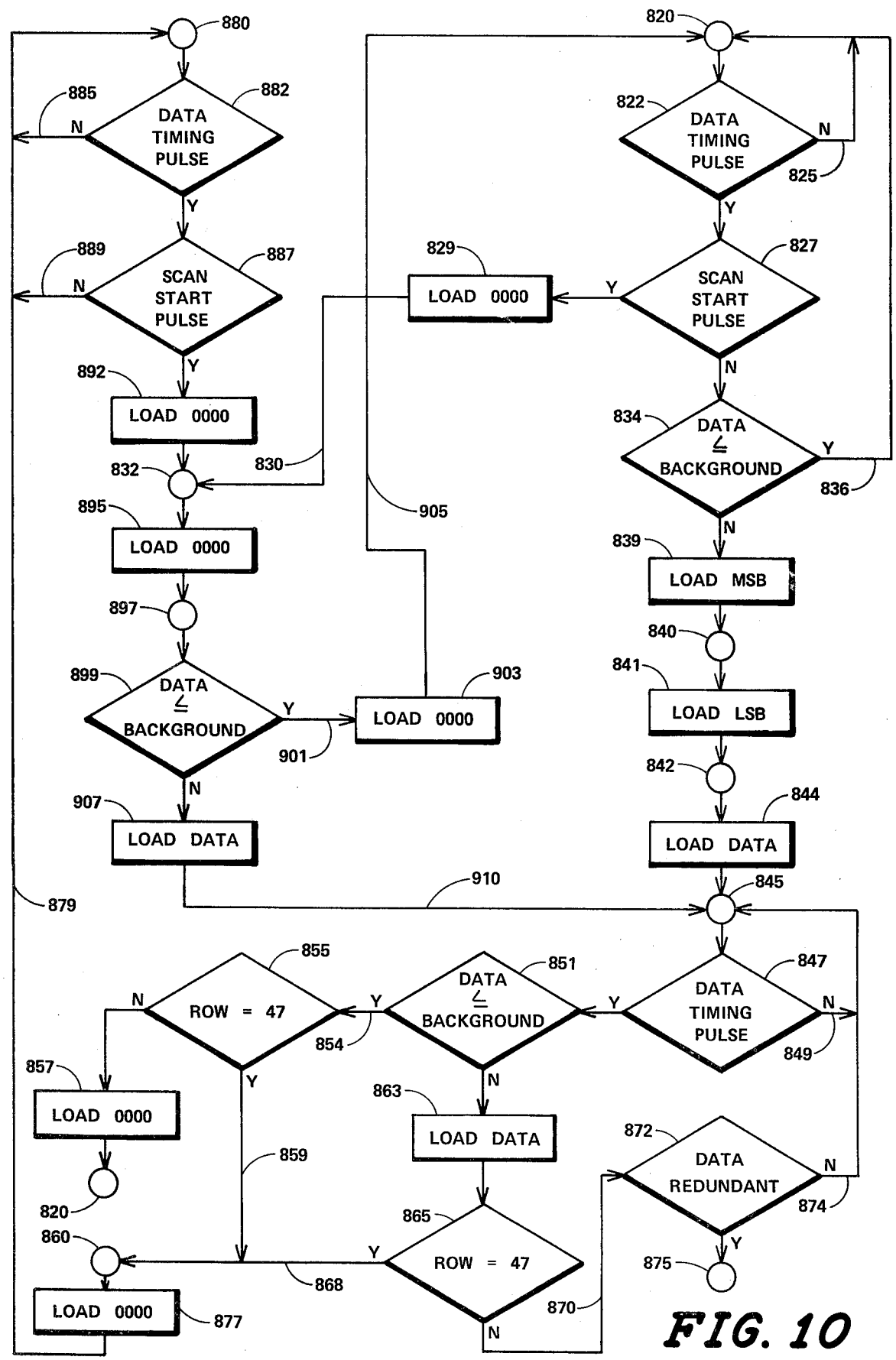
FIGS. 10 and 11 are functional flow diagrams of the data compressor shown in FIGS. 2, 4 and 5.
Figure 11:
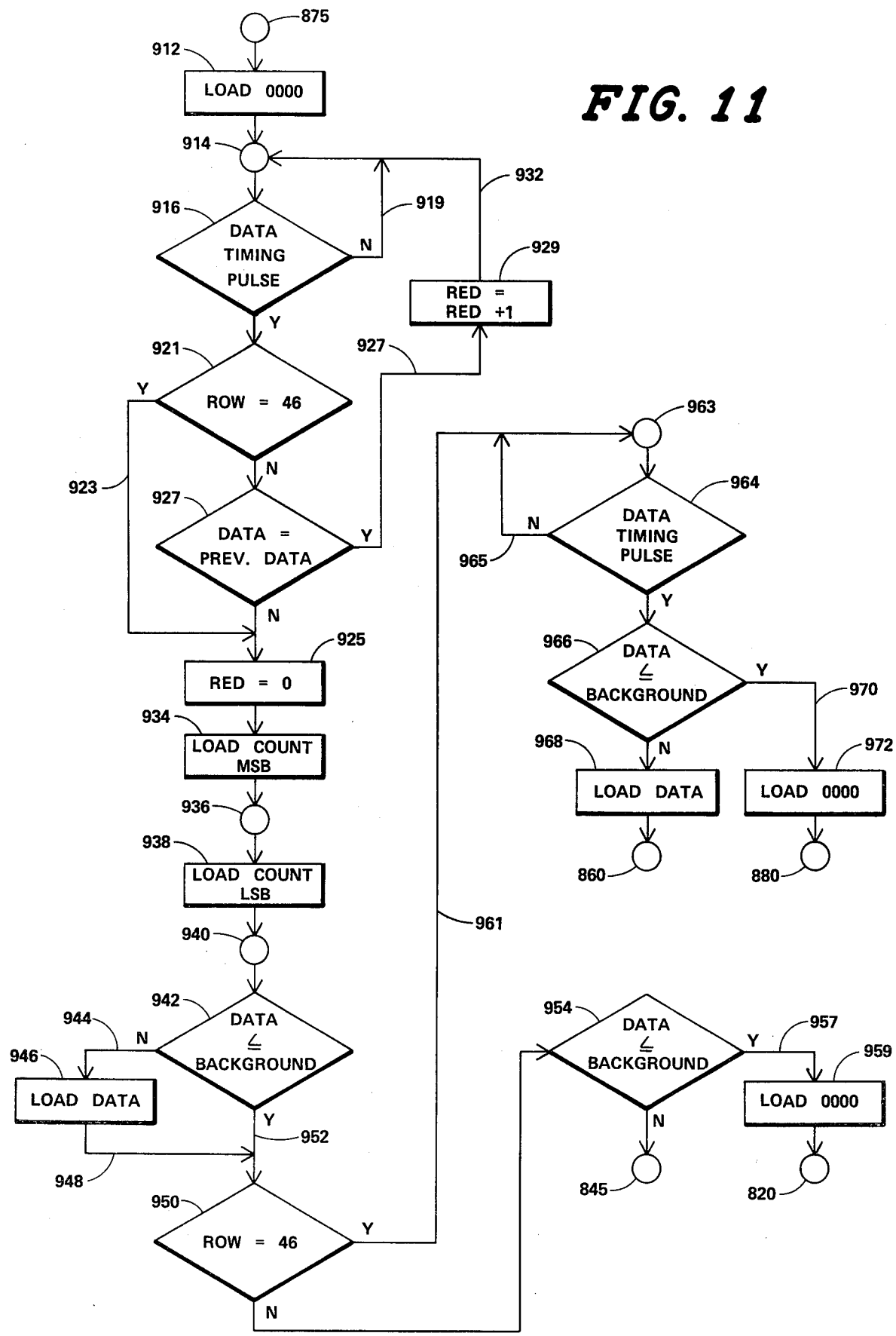

The operation of the data compressor 20 is best summarized by reference to the flow diagrams of FIGS. 10 and 11. Assuming that the logic is in state 820 (FIG. 10) the logic flows to state 822 where a test is made to determine if a data timing pulse is resent. If the data timing pulse is not present logic flows through path 825 to state 820. If the data timing pulse is present the logic flows to state 827. In state 827 a test is made to determine if the scan start pulse which is delayed through the shift registers is present. If the scan start pulse is received, the logic enters step 829 wherein multiplexer 33 is commanded to generate a 0000 output and that output is loaded into the byte storage register 59. From step 829 the logic flows through logic path 830 to state 832. If the scan start pulse is not detected the logic flows to state 834 where the digital signal present in shift register 104 is tested to determine if it is less than or equal to the background. If the digital signal is less than or equal to the background the logic continues through logic path 836 to reenter state 820. If the digital signal in shift register 104 exceeds the background level, the logic proceeds from state 834 to step 839 where the portion of the address contained within counter 500 (FIG. 9) is loaded into byte storage register 59. The logic then goes to state 840 then on to step 841 wherein the portion of the address contained within counter 502 (FIG. 9) is loaded into byte storage register 59. The logic then proceeds to state 842 and from state 842 to step 844. In step 844 the digital signal presently stored in shift register 104 is loaded into byte storage register 59.

From step 844 the logic continues to state 845, and from state 845 to state 847 wherein the presence of a data timing pulse is determined. If the data timing pulse is not present the logic returns through path 849 to state 845 and circulates through states 845 and 847 and logic path 849 until the receipt of the data timing pulse. After receipt of the data timing pulse logic flows to state 851 which tests to determine if the digital signal contained within shift register 104 is equal to or less than background level. If the data is below or equal to the background level the logic flows through path 854 to state 855. In step 855 if the row count is not equal to 47, the logic proceeds to step 857. At step 857 the multiplexer 33 is commanded to generate a '0000' output and that output is loaded into byte storage register 59. The 0000 output is, of course, a portion of the control marker. The logic returns to state 820 from step 857 and proceeds from state 820 as discussed above. If the row count is equal to 47, the logic proceeds through logic path 859 to state 860. If at state 851 the data contained within shift register 104 exceeds the background level, the logic flows to step 863. In step 863 the data contained within shift register 104 is loaded into byte storage register 59. The logic then proceeds from step 863 to state 865.

At state 865 the count in counters 500 and 502 is tested to determine if the count contained therein is equal to 47. If the count is equal to 47, the logic proceeds through path 868 to state 860. On the other hand, if the count is not equal to 47 the logic proceeds from state 865 through logic path 870 to state 872. At state 872 the output of data redundant indicator 160 on line 168 (FIG. 4) is tested to determine if the data is redundant. If the data is not redundant that is the signal on line 168 is low (as discussed above) the data proceeds from state 872 through logic path 874 and returns to state 845. If the output of indicator 160 to line 168 is high the logic flows to state 875.

From state 860 the logic proceeds to step 877 which causes the multiplexer to generate a '0000' output and that output is loaded into byte storage register 59. Logic flows from step 877 through logic logic path 879 to state 880. The logic continues through state 880 to state 882 wherein the receipt of a data timing pulse is determined. If the data timing pulse is not received the logic recycles through logic path 885 to state 880. After the receipt of the data timing pulse the logic enters state 887 which tests for the presence or receipt of the scan start pulse.

If the scan start pulse is not received the logic cycles through path 889 to state 880. When the scan start pulse is received while the logic is in state 887 the logic proceeds to step 892. At step 892 the multiplexer 33 is commanded to generate a '0000' output and that output is loaded into byte storage register 59. Logic then flows from step 892 to state 832. From state 832 logic enters step 895 wherein the multiplexer again generates a '0000' output and that output is loaded into byte storage register 59. From step 895 the logic enters state 897 and from state 897 the logic goes to state 899.

Within state 899 a test is made to determine if the digital signal in shift register 104 is less than or equal to the background level. If the signal on line 195 is low so indicating the logic flows through path 901 to step 903. At step 903 the multiplexer is again commanded to generate a '0000' output and that output is loaded into byte storage register 59 (as discussed above). From step 903 the logic goes through path 905, reenters state 820 and proceeds from state 820 as discussed above. If at state 899 the data within shift register 104 is above the background level logic flows from state 899 to step 907. At step 907 the output of shift register 104 is selected as the output of multiplexer 33 and the digital signal contained within shift register 104 is loaded into byte storage register 59. After the digital signal is loaded into byte storage register 59 the logic proceeds through logic path 910 to state 845.

If the output of data redundant indicator 160 to line 168 is high and the logic is in state 872, the logic flows through state 875 to step 912 (FIG. 11). While the logic is in step 912 the multiplexer 33 generates a 0000 output which is loaded into byte storage register 59. The logic then enters state 914 and from state 914 onto state 916. Within state 916 a test is performed to determine the presence of a data timing pulse. If the data timing pulse is not present the logic proceeds through the path 919 and recycles to state 914. When the data timing pulse is detected the logic enters state 921 from state 916. Within state 921 if the count contained within counters 500 and 502 (FIG. 9) is equal to 46 the logic flows through path 923 to step 925. If the row count is not equal to 46 the logic exits state 921 and enters state 927 wherein the output of comparator 127, which has been delayed so that the digital signal determined as equal or not equal by comparator 127 is in shift register 104, is examined. If the train of redundancy signals has ended that is the digital signal within shift register 104 is not a digital signal within a train of redundant signals, the logic moves from state 927 to step 925. If the digital signal within shift register 104 is a digital signal within a train of redundant signals logic proceeds through path 927 to step 929. At step 929 the redundancy count is increased by one and the logic proceeds through path 932 to state 914.

At step 925 the redundancy count is reset to zero but as discussed above this has no effect on the redundancy count stored within unit 164 (FIG. 4). From step 925 the logic goes to step 934 wherein the most significant bits of the redundancy count within unit 164 are selected as the output of multiplexer 176 and loaded into byte storage register 59 through multiplexer 33. The multiplexer 176 (FIG. 3) has its most significant bit set to a logic one and the next most significant bit set to zero which provides the remainder of the control marker. The first portion of the control marker was set in step 912. The logic then flows through state 936 to step 938 wherein the four least significant bits of the redundancy count are loaded through multiplexers 176 and 33 into byte storage register 59. From step 938 the logic goes through state 940 to state 942. At state 942 a test again is made to determine if the digital signal is equal to or below that of the background. If the data is greater than the background logic flows through path 944 to step 946 wherein the digital signal contained within shift register 104 is loaded into byte storage register 59 through multiplexer 33.

After step 946 is completed, the logic moves through path 948 to state 950. If the digital signal within byte storage register 59 is below or equal to the background level, logic proceeds through path 952 from state 942 to state 950. If the row count maintained by the address counters 500 and 502 is not equal to 46 the logic proceeds from state 950 to state 954. Within state 954 a test is again made to determine if the data is less than or equal to the background level. If the data is equal to or below the background the logic flows through path 957 to step 959. At step 959 multiplexer 33 is commanded to output '0000' and that output is loaded into byte storage register 59 as the control marker and from step 959 the logic proceeds to state 820. If while the logic is in state 954 the data contained within shift register 104 is above the background, the logic flow is from state 954 to state 845.

If while the logic is in state 950, the row count is equal to 46 the logic goes through path 961 to state 963. From state 963 the logic proceeds to state 964 wherein a test is made to determine if a data timing pulse is present. If the data timing pulse is not detected the logic flows through path 965 and recycles through state 963. When the data timing pulse is received the logic exits state 964 and goes to state 966. In state 966, a test is once again made to determine if the digital signal is equal to or below the background level. If the digital signal is above the background the logic proceeds to step 968 and the digital signal contained within shift register 104 is loaded through multiplexer 33 into byte storage 59. From step 968 the logic proceeds to state 860. If while the logic is in state 966, the digital signal within shift register 104 is at or below the background level, logic flows through logic path 970 to step 972. At logic step 972 the multiplexer 33 is again commanded to output a 0000 and that output is loaded into byte storage register 59. From step 972 the logic enters state 880.

It should be noted that after the receipt of every data timing pulse the address generated by counters 500 and 502 which is loaded during logic states 839 and 841 is increased by one.

The four bit words shown in table II are here below derived from the raw data of table I utilizing the logic diagrams of FIGS. 10 and 11. Assuming that logic is cycling through states 820 and 822 when the data timing pulse is received the logic continues to state 822 where the scan start pulse is received. Before entering state 820 byte number 1,000, is generated by multiplexer 33 in either step 903, step 857, or step 959. After the scan start pulse is received, the logic moves to step 829. At state 829 to 0000 of byte number 2 is generated by multiplexer 33. The logic then proceeds through state 832 to step 895 wherein the 0000 of byte number 3 is generated by multiplexer 33. After step 895 the logic goes through state 897 to state 899. In this example the background level has been set at 0000 and therefore anything above 0000 will be passed through the data compressor 20 to the byte storage register 59. At state 899 the first bit of raw data "D" is tested to determine if it is above the background level. Therefore, the logic proceeds to step 907 and "D" which is present at the output of shift register 104 is selected as the output of multiplexer 33. This is byte number 4. From step 907 the logic proceeds through state 845 to state 847.

After the data timing pulse is received the logic moves from state 847 to state 851 wherein the data in shift register 104 is tested to determine if it is above the background. Because the data is not '0000' logic proceeds to step 863 wherein the data contained within shift register 104, "F", '1111', is selected as the output of multiplexer 33 and a load signal is sent. This is byte number 5 of table II. Because the row count is not equal to 47, the logic proceeds through state 865 to state 872. Byte number 5 represents the first of a train of redundant signals and four such signals already having been detected the logic will continue through state 872 and state 875 to step 912. In step 912 byte number 6, '0000', is generated by multiplexer 33 and the proper load signal is sent. The logic then continues through state 814 to state 816 and upon the receipt of a data timing pulse to state 921. Because the row count is not equal to 47, the logic continues through state 921 to state 927 because of the train of pulses is still being received the logic cycles through step 929, state 914, state 916, state 921 and state 927 until the last "F" i.e. the comparator 127 detects the last "F" and the '5' are not redundant. In the example the difference allowable between adjacent digital signals within the data stream to determine redundancy is '0000'. Thus, in the example the signals in order to be redundant must be equal.

After the last redundant signal is detected and such detection is prior to the row count equaling 46, the logic proceeds from state 927 through step 934, state 936, and step 938. Thus, the remainder of control marker that is a 1 followed by a 0 and the two most significant bits of the redundancy count are selected as the output of multiplexer 33. This is byte number 7 in table II. In step 938, byte number 8 which is the four least significant bits of the redundancy count is selected as the output of multiplexer 33. The redundancy count is equal to 21. The logic proceeds from step 938 through state 940 to state 942 wherein '5' is compared to the background level to determine if it is above the background level and, because it is, the logic proceeds to step 946 where '5' is selected as the output of multiplexer 33. This '5' is loaded into byte storage register 59 and is byte number 9, '0101', of table II.

The logic then proceeds from step 946 through state 950 (because the row count is not equal to 46) to state 954 wherein the test on digital signal which is equal to the '5' stored within shift register 104 is compared to the background. Since '5' is above the background, the logic proceeds through state 845 to state 847 and awaits a data timing pulse which indicates that a new digital signal is present in shift register 104.

After the data timing pulse is received logic proceeds to state 851 wherein the data is tested against the background. Because this data is a digital signal '0' the logic proceeds to step 855 through state 857 (because the row count is not equal to 47). At state 855 the multiplexer 33 generates a '0000' output which is byte number 10 of table II. The logic then proceeds through state 822 and awaits a data timing pulse and because the scan start pulse is not received at this time the logic proceeds through state 827 to state 834. Since the next bit of data is also a digital signal "0" the 0000 logic proceeds to state 820 and continues to recycle through this loop until the presence of the next signal which is not a '0' digital signal is detected. When, '7' is present in shift register 104 the logic then proceeds through step 839 wherein byte number 11 of table II is loaded, and through state 840 to step 841 wherein byte number 12 is selected as the output of multiplexer 33. The address represented by byte numbers 11 and 12 is 31 which is the location of the '7' within the scan. Because the most significant bit of byte number 11 is '0' during later reconstruction these two bytes after the first part of the control marker i.e., byte number 10 which is '0000', is understood as an address. Byte numbers 7 and 8 are understood to be a redundancy count because the most significant bit of byte number 7 after the first part of the control marker i.e. byte number 6 which '000' of table II is a logic "1". The logic proceeds from step 841 through state 842 on to step 844 wherein the byte number 13 i.e. the digital signal "", '0111', is selected as the output of multiplexer 33. The logic then proceeds through state 845 to state 847 wherein after a data timing pulse is detected the logic proceeds to state 851. Because the data is above background level, the logic goes from state 851 to step 863 wherein the output of shift register 104 is selected as the output of multiplexer 33. This is byte number 14 of table Ii and is an '8' represented digitally as '1000'. Logic then proceeds through state 865 because the row count is not equal to 47 to state 872. Because redundancy is not detected, the logic proceeds to state 847 through state 845. Byte number 15, '1010' which is a digital signal "A", is loaded in a similar manner. When the next '0000' digital signal is received the logic goes from state 851 through state 855 to step 857 wherein byte number 16, '0000', is generated by multiplexer 33. From state 855 the logic flows to state 822 through state 820, and as data timing pulses are received through state 827 and 834 and returning to state 820 because the digital signals are '0000'. Upon receipt of the next scan start pulse the logic flows from state 827 to step 829 and byte number 17, '0000', is generated within multiplexer 33. From step 829 the logic proceeds to step 895 through state 832 and in step 895 byte number 18, '0000', is generated within multiplexer 33.

If the logic is initially in state 880 when the scan start pulse for the raw data in table I is received, the logic would proceed from state 887 to step 892. Byte number 1, '0000', loaded prior to entry into state 880 in either step 877 or 972. In step 892 byte number 2, '0000', of table II is generated within multiplexer 33. The logic then proceeds to step 832 and from step 832 through the flow diagrams of FIGS. 10 and 11 as discussed above. It should also be pointed out that if the system has been reset and this is the first scan of data from the data lift, the entry point into the logic is through step 860 which is equivalent to flip-flop 404 of FIG. 6. After reset the logic enters state 860 and proceeds to load a first byte which is '0000' in step 877. Thereafter the logic continues as discussed above.

The row counter is reset to one when a scan start pulse is received and the row counter is incremented by one each occasion a data timing pulse is received. These steps have not been incorporated within the flow diagrams of FIG. 10 and 11. Also, the redundancy count would be equal to four prior to entry in the loop fo which step 929 is a part.

In summary, at the start of each scan the scan start pulse resets the address counters contained within the controller 172 of the data compressor 20. The controller provides selection signals to 2 multiplexers, 33 and 176, of the data compressor 20. The digital signal selected by the controller 172 which appears as the output of multiplexer 33 is the output of the data compressor. A load signal is also provided to the apparatus accepting the output of the data compressor in order that it may load the output of the multiplexer 33 at the proper time. A redundancy counter counts the output of a comparing system which determines if adjacent digital signals in a data stream are identical (or represent a cluster of closely related signals to the redundant signal of the train). If 4 or more signals are determined to be redundant the count within the redundancy counter is stored within a shift register until after the last signal in the train of redundant signals is received. Redundancy count is then selected by the controller as the output of multiplexer 33. A primary signal which in the above example was '0000' is selected as the digital signal which is to be removed from the data stream and replaced by the address within each scan of data for the next signal which is not of the primary signal. Thus, in the example all of the '0000' signals are replaced by a control marker which in the example is the primary signal '0000' and the address of the next digital signal in the data stream which is not '0000'. Further, a group of signals which are closely associated with the primary signal i.e. the difference in magnitude between a primary signal and the digital signals within the group can also be eliminated from the data stream and replaced by the address of the next signal which is not a primary signal nor one of the group of closely related signals. In the exmaple the group of closely associated signals is generally referred to as the background level and represents those signals closely related in magnitude to the '0000', for example, '0001', '0010', etc. Control markers are substituted for the digital signals eliminated from the data stream.

Having described the invention in connection with certain specific embodiments thereof, it is to be understood that further modifications may now suggest themselves to those skilled in the art and it is intended to cover such modifications as fall within the scope of the appended claims.

What is claimed is:

1. Data compressor for compressing a stream of digital signals, said stream including trains of serially redundant signals and a primary signal frequently occurring in said stream comprising; a memory means receiving and storing said signals serially; a sequencer in communication with said memory means, said sequencer means including means for eliminating said primary signals from said stream and substituting an address within said stream to the next signal other than said primary signal therefor, and means for eliminating from said stream said trains of redundant signals leaving one digital signal of each of said trains and substituting a count of number of redundant signals of each train therefor.

2. Data compressor as set forth in claim 1 wherein said means for eliminating said train is responsive to trains of redundant signals containing more than four digital signals therein.

3. Data compressor as set forth in claim 1 wherein said trains of redundant signals comprise a cluster of digital signals closely related in magnitude.

4. Data compressor as set forth in claim 1 wherein said primary signal comprises a group of digital signals closely related in magnitude to said primary signal.

5. Data compressor as set forth in claim 4 wherein said primary signal is zero.

6. Data compressor as set forth in claim 1 wherein said sequencer includes a multiplexer connected to said memory means for serially outputting said stream selectively, and wherein said means for eliminating said trains includes a redundancy counter in communication with said memory means for counting redundant signals, and said means for eliminating said primary signals includes and address means for assigning addresses to each of said digital signals within said stream.

7. Data compressor as set forth in claim 6 wherein said means for eliminating said primary signals commands said multiplexer to output a first control marker prior to selecting the address of said address means as the output of said multiplexer.

8. Data compressor as set forth in claim 6 wherein said means for eliminating said trains commands said multiplexer to output a second control marker prior to selecting the count of said redundancy counter as the output of said multiplexer.

9. Data compressor as set forth in claim 6 including a magnitude of difference calculating means for determining difference in magnitude between adjacent digital signals in said stream, said magnitude means having its output communicated to said redundancy counter and wherein said redundancy counter counts as redundant any adjacent signal having a magnitude of difference less than a certain predetermined value.

10. A data compressor for compressing a data stream comprised of multi-bit digital signals receiving a scan start pulse to indicate a new row of said digital signals, comprising a plurality of shift registers adapted to receive and store as an output said digital signals; said shift registers being connected in series with a first shift register in said series receiving said digital signals as an input, said series including a last shift register; an address counter responsive to said scan start pulse to begin counting said digital signal for providing an individualized address associated with each of said digital signals; a comparator comparing adjacent digital signals in said stream for a train of redundant digital signals; a redundancy counter counting the number of redundant digital signals in each train as determined by said comparator; a multiplexer means connected to said last shift register for selectively outputting said digital signals and in communication with said redundancy counter and said address counter for selectively outputting counts contained therein, said multiplexer means adapted to generate control markers at its output; and a controller connected to said multiplexer means for commanding said multiplexer means to substitute a first control marker and the count in said address counter for primary signals occurring in said stream, said controller commanding said multiplexer to output the address of the next digital signal following said primary signals, said controller also commanding said multiplexer to substitute a second control marker and the count in said redundancy counter for each of said trains except for one digital signal thereof.

11. A data compressor receiving a stream of digital signals containing digital signals of a primary value frequently occurring within said stream and trains of redundant signals, comprising: a memory receiving and serially storing said stream of digital signals; a first multiplexer connected to said memory to selectively receive said stream serially; a redundancy counter counting the number of redundant signals in each of said trains; a controller means in communication with said memory for assigning an address to each of said digital signals and commanding said first multiplexer to transfer to its output said stream of digital signals, said controller means commanding said first multiplexer to eliminate said primary signal and substitute a first control marker and the address from said controller of the next digital signal in said train being other than said primary signal therefor, said controller means also commanding said first multiplexer to eliminate said trains of redundant signals except for one digital signal of each of said trains and substitute a second control marker and the count of said redundancy counter therefore.

12. Data compressor as set forth in claim 11 wherein said first multiplexer generates a portion of said first control marker and said address counter generates remainder of said first control marker.

13. Data compressor as set forth in claim 11 includes a second multiplexer connected intermediate said redundancy counter and said first multiplexer and wherein said first generates a portion of said second control marker and said second multiplexer generates remainder of said second control marker.

14. A data compressor receiving multibit digital signals representing various levels in a stream from an information source, said source also producing a scan start pulse to indicate a block of said digital signals comprising; a plurality of shift registers adapted to receive and store as an output said digital signals; said shift registers being connected in a series for moving said digital signals serially there through and including a first shift register receiving said digital signals as an input and a last shift register in said series; a controller means including an address counter responsive to said scan start pulse to begin counting said digital signals for providing an individualized address associated with each of said digital signals within a scan; a comparator examining adjacent digital signals in said stream for serially redundant digital signals; a redundancy counter for counting redundancies determined by said comparator; and a multiplexer connected to said controller means and to said last shift register for selectively outputting said digital signals of said stream; said controller means responsive to digital signals stored in said last shift register for commanding said multiplexer means to output a first control marker and the address of next digital signal of other than certain predetermined levels, said controller means also commanding said multiplexer to output one digital signal of said serially redundant signals, a second control marker, and the count of said serially redundant signals in said redundancy counter.

15. Data compressor as set forth in claim 14 wherein said serially redundant signals are a cluster of redundant signals having a small magnitude of difference between their levels.

16. Data compressor as set forth in claim 15 including a magnitude of difference calculator to determine the magnitude of difference between adjacent signals in said stream, and wherein said comparator is connected to said magnitude of difference calculator for comparing the difference between adjacent signals to a certain predetermined value for determining if a particular digital signal is one of said cluster.

17. Data compressor for compressing a stream of digital signals comprising a shift register means receiving and storing serially said signals; a sequencer monitoring said register for detecting and eliminating from said stream signals of certain levels by substituting a first control marker and an address to the next digital signal other than those of said certain levels therefor, and eliminating from said stream redundant digital signals of greater than a certain length after passing one of said redundant signals and substituting a second control marker and a count of said redundant signals into said stream therefor; and a multiplexer connected to output of the said register means and to said sequencer, said multiplexer being adapted to respond to said sequencer to select as an output said digital signals from said register means, the count of the number of redundant signals, and the address of a digital signal other than those of said certain levels for eliminating primary signals and redundant signals from said stream.

18. Data compressor as set forth in claim 17 wherein said sequencer includes an address means connected to said multiplexer for counting digital signals from a scan start pulse to provide an individual address for each digital signal within a scan.

19. Data compressor as set forth in claim 17 wherein said sequencer includes a redundancy counter counting successive redundancies in communication with said multiplexer.

* * * * *